United States Patent
Yamazaki et al.

(10) Patent No.: US 7,888,167 B2
(45) Date of Patent: Feb. 15, 2011

(54) PHOTOELECTRIC CONVERSION DEVICE AND METHOD FOR MANUFACTURING THE SAME

(75) Inventors: Shunpei Yamazaki, Tokyo (JP); Satoshi Toriumi, Kanagawa (JP); Tomokazu Yokoi, Kanagawa (JP); Makoto Furuno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/422,577

(22) Filed: Apr. 13, 2009

(65) Prior Publication Data
US 2009/0267066 A1    Oct. 29, 2009

(30) Foreign Application Priority Data
Apr. 25, 2008    (JP) .............................. 2008-116079

(51) Int. Cl.
H01L 21/00    (2006.01)
(52) U.S. Cl. .................. 438/96; 257/53; 257/E31.045; 257/E31.047; 257/E21.297; 136/258; 427/74; 427/574
(58) Field of Classification Search .............. 136/254, 136/258, 261; 427/74, 255.28, 255.393, 427/574; 438/96; 257/53, E21.297, E31.045, 257/E31.047
See application file for complete search history.

(56) References Cited
U.S. PATENT DOCUMENTS

| | | | |
|---|---|---|---|
| 4,409,134 A | | 10/1983 | Yamazaki |
| 4,771,015 A | * | 9/1988 | Kanai et al. .................. 427/574 |
| 5,007,971 A | * | 4/1991 | Kanai et al. .................. 136/258 |
| 5,810,945 A | | 9/1998 | Stutzmann et al. |
| 6,268,235 B1 | | 7/2001 | Sakakura et al. |
| 6,287,888 B1 | | 9/2001 | Sakakura et al. |
| 6,326,304 B1 | * | 12/2001 | Yoshimi et al. ............. 438/680 |

(Continued)

FOREIGN PATENT DOCUMENTS

JP    62-062073    12/1987

(Continued)

OTHER PUBLICATIONS

Baojie Yan et al.; "Correlation of Current Mismatch and Fill Factor in Amorphous and Nanocrystalline Silicon Based Efficiency Multi-Junction Solar Cells"; *Conference Record of the 33th IEEE PVSC (Photovoltaic Specialists Conference)*, vol. 5, pp. 12-16; 2008.

*Primary Examiner*—Mary Wilczewski
*Assistant Examiner*—Toniae M Thomas
(74) *Attorney, Agent, or Firm*—Fish & Richardson P.C.

(57) ABSTRACT

To provide a photoelectric conversion device with improved photoelectric conversion characteristics and cost competitiveness. A photoelectric conversion device including a semiconductor junction has a semiconductor layer in which a needle-like crystal is made to grow over an impurity semiconductor layer. The impurity semiconductor layer is formed of a microcrystalline semiconductor and includes an impurity imparting one conductivity type. An amorphous semiconductor layer is deposited on a microcrystalline semiconductor layer by setting the flow rate of a dilution gas (typically silane) to 1 time to 6 times the flow rate of a semiconductor source gas (typically hydrogen) at the time of deposition. Thus, a crystal with a three-dimensional shape tapered in a direction of the deposition of a film, i.e., in a direction from the microcrystalline semiconductor layer to the amorphous semiconductor layer is made to grow.

8 Claims, 22 Drawing Sheets

| U.S. PATENT DOCUMENTS | | | | FOREIGN PATENT DOCUMENTS | | |
|---|---|---|---|---|---|---|
| 6,531,711 B2 | 3/2003 | Sakakura et al. | | JP | 02-053941 | 11/1990 |
| 2009/0047752 A1 | 2/2009 | Yamazaki et al. | | JP | 2000-277439 | 10/2000 |
| 2009/0277504 A1 | 11/2009 | Yamazaki | | | | |
| 2009/0293954 A1 | 12/2009 | Yamazaki | | * cited by examiner | | |

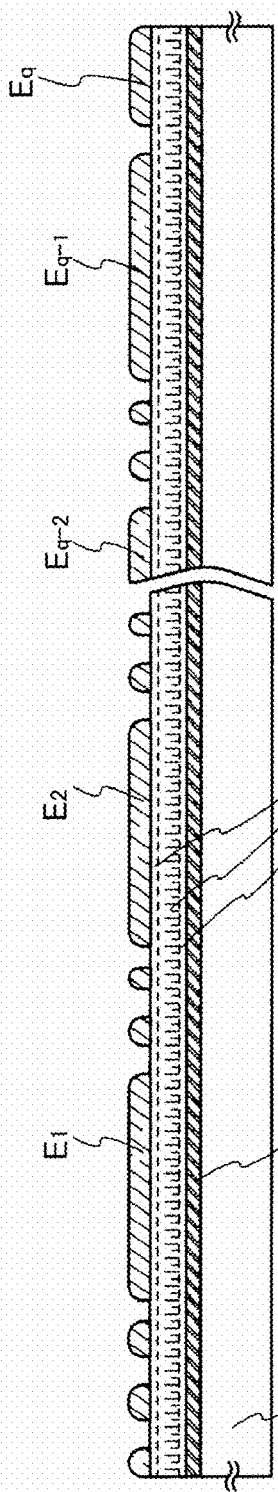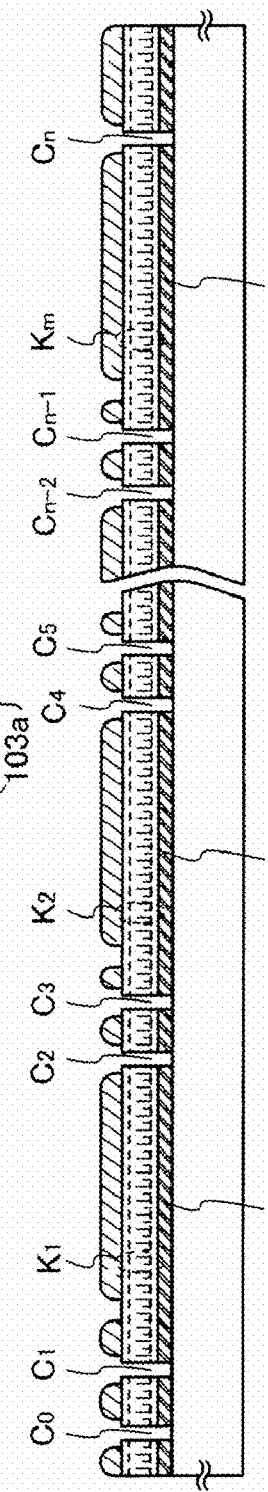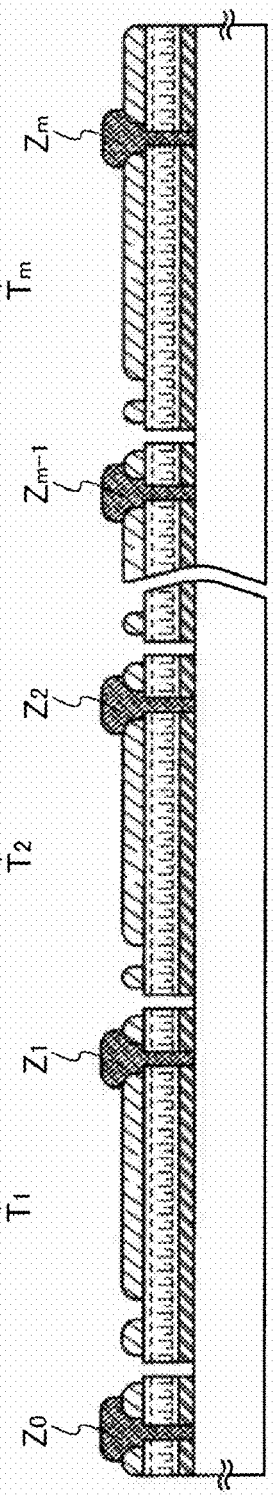
FIG. 7A
FIG. 7B
FIG. 7C

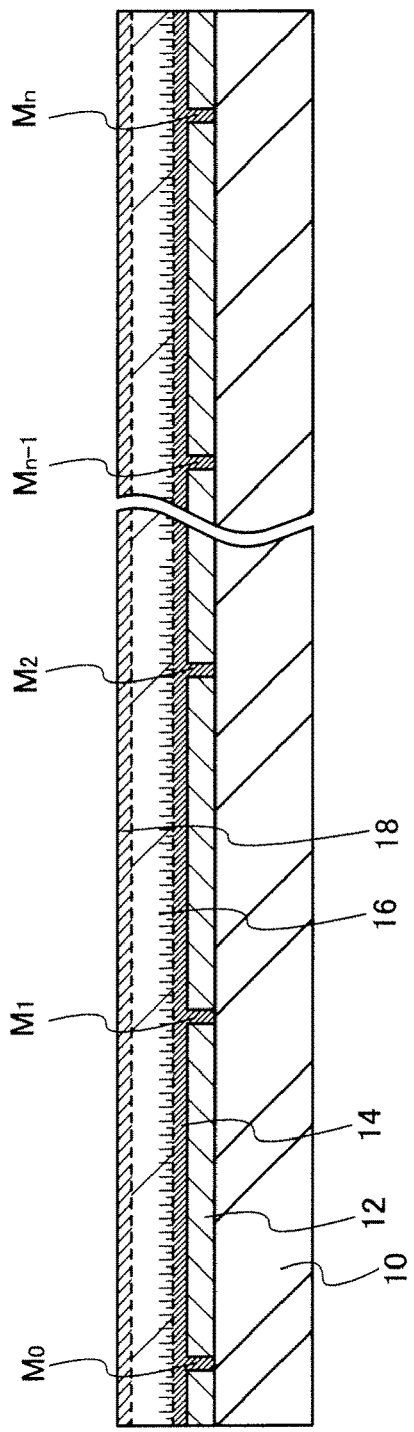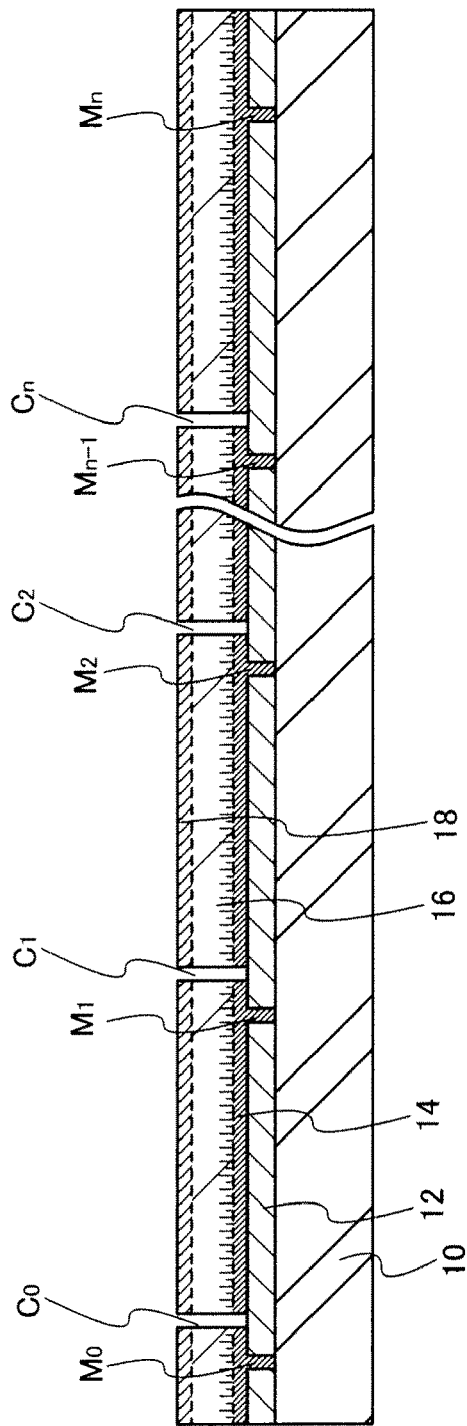

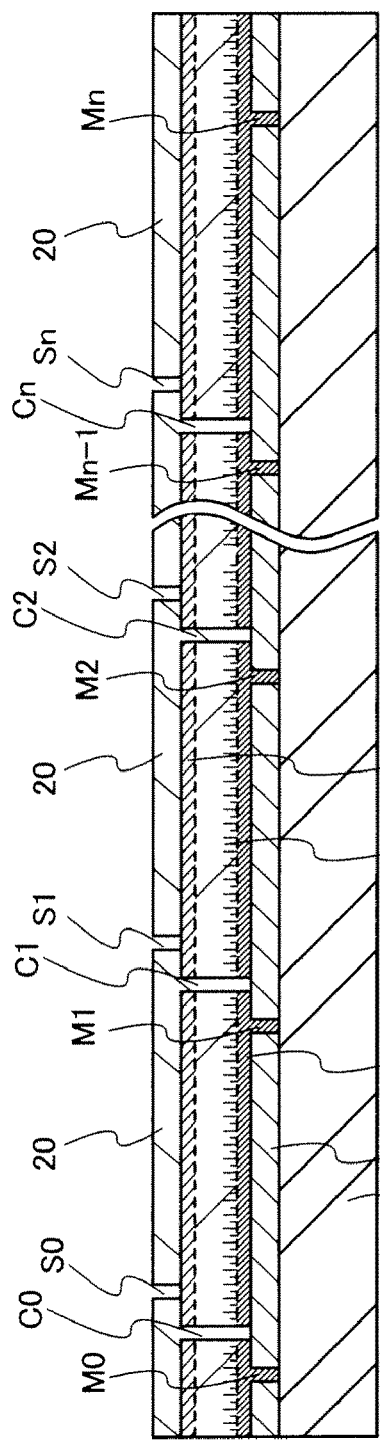
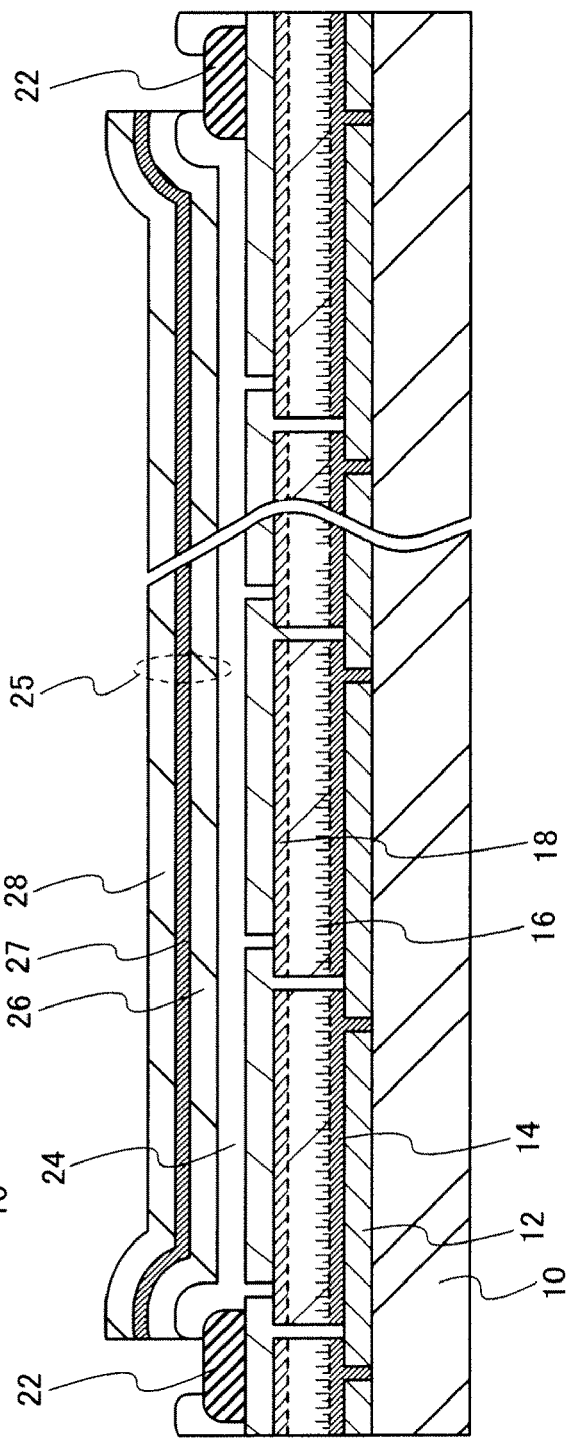
FIG. 12A
FIG. 12B

PHOTOELECTRIC CONVERSION DEVICE AND METHOD FOR MANUFACTURING THE SAME

BACKGROUND OF THE INVENTION

1. Field of the Invention

The present invention relates to a photoelectric conversion device having a semiconductor junction and a method for manufacturing the photoelectric conversion device.

2. Description of the Related Art

In response to global environmental issues in recent years, the market for photoelectric conversion devices typified by solar cells such as residential photovoltaic systems has expanded. Bulk photoelectric conversion devices which are formed using single crystal silicon or polycrystalline silicon with high photoelectric conversion efficiency have already been put into practical use. The photoelectric conversion devices using single crystal silicon or polycrystalline silicon are manufactured by being cut out of large silicon ingots. However, it takes a long time to manufacture large silicon ingots, which means productivity is low, and since supply of raw materials of silicon itself is limited, the supply of silicon ingots is insufficient and cannot respond to the expansion of the market.

While shortage of silicon materials is obvious as described above, thin film photoelectric conversion devices formed using amorphous silicon thin films and microcrystalline silicon thin films has attracted attentions. In thin film photoelectric conversion devices, silicon thin films are formed over supporting substrates by a variety of chemical or physical vapor deposition methods. Therefore, it is said that thin film photoelectric conversion devices can save resources and can achieve low cost as compared to bulk photoelectric conversion devices.

In addition, a photoelectric conversion device formed using a microcrystalline silicon thin film which can be manufactured by a plasma CVD method is developed (for example, see Patent Document 1: Japanese Published Patent Application No. 2000-277439).

As a crystal-system silicon film formed by a plasma CVD method and a photoelectric conversion device using the crystal-system silicon film, a photoelectric conversion device using a semi-amorphous semiconductor are reported (for example, refer to References 2 and 3: Japanese Examined Patent Application Publication No. H2-53941 and Japanese Examined Patent Application Publication No, S62-62073). The semi-amorphous semiconductor has a semi-amorphous or semi-crystalline structure, which is different from an amorphous semiconductor or a crystalline semiconductor.

SUMMARY OF THE INVENTION

However, the penetration rate of photoelectric conversion devices using amorphous silicon thin films is lower than that of bulk photoelectric conversion devices because problems of photodegradation called Staebler-Wronski effect, lower photoelectric conversion efficiency than that of a bulk photoelectric conversion device, or the like can not be overcome.

These problems can be solved by the present invention, and it is an object of the present invention to improve photoelectric conversion characteristics of a thin film photoelectric conversion device.

One embodiment of the present invention is a photoelectric conversion device which includes a semiconductor junction and includes a semiconductor layer in which a crystal with a three-dimensional shape tapered in a direction toward a surface of a film (a needle-like crystal) grows over an impurity semiconductor layer of one conductivity type which is formed using a microcrystalline semiconductor. Further, a main portion of a region which converts light into electricity is formed using a semiconductor layer in which a crystal with a three-dimensional tapered shape (a needle-like crystal) is made to grow.

A semiconductor source gas (typically, silane) and a dilution gas (typically, hydrogen) which are mixed in a mixing ratio at which an amorphous semiconductor can be formed are introduced into a reaction space and plasma is produced to deposit a film on a microcrystalline semiconductor layer. At this time, the film is deposited by setting the flow rate of a dilution gas to 1 time to 6 times that of a semiconductor source gas at the initial stage of the deposition. Thus, an amorphous semiconductor layer is deposited on the microcrystalline semiconductor layer, and a crystal with a three-dimensional shape tapered in a direction of deposition of the film is made to grow in the amorphous semiconductor layer. That is, a crystal extending in a direction of deposition of the film deposited on the microcrystalline semiconductor layer (a needle-like crystal) is made to grow.

Alternatively, a semiconductor source gas and a dilution gas which are mixed in a mixing ratio at which a microcrystalline semiconductor can be formed are introduced into a reaction space and plasma is produced to deposit a film. Thus, a microcrystalline semiconductor layer is formed. A film is deposited on the microcrystalline semiconductor layer by reducing the flow ratio of a dilution gas to a semiconductor source gas as compared to a reaction gas used for deposition of the microcrystalline semiconductor layer. Thus, an amorphous semiconductor layer including a crystal with a three-dimensional shape tapered in a direction of deposition of the film (a needle-like crystal) is formed over the microcrystalline semiconductor layer.

Another embodiment of the present invention is a photoelectric conversion device including a first semiconductor layer which is provided over a first electrode and includes an impurity element imparting one conductivity type; a second semiconductor layer provided over the first semiconductor layer; a third semiconductor layer which is provided over the second semiconductor layer and includes an impurity element imparting a conductivity type opposite to the first semiconductor layer; and a second electrode provided over the third semiconductor layer. In the photoelectric conversion device, the second semiconductor layer includes a crystal with a three-dimensional shape tapered in a direction from an interface with the first semiconductor layer toward an interface with the third semiconductor layer.

In the above structure, the first semiconductor layer is formed using a p type semiconductor, and the second semiconductor layer is formed using an i type semiconductor. Further, the third semiconductor layer is formed using an n type semiconductor.

In the above structure, the first semiconductor layer is a microcrystalline semiconductor, and the second semiconductor layer has a structure in which a needle-like crystal of a crystalline semiconductor is present in an amorphous semiconductor.

Another embodiment of the present invention is a method for manufacturing a photoelectric conversion device including the steps of forming a first electrode over a substrate; forming a first semiconductor layer of a microcrystalline semiconductor including an impurity element imparting one conductivity type, over the first electrode, by introducing a reaction gas including a semiconductor source gas and a dilution gas which are mixed in a mixing ratio at which a microcrystalline semiconductor can be formed into a reaction chamber and producing plasma to deposit a film; forming a second semiconductor layer including a crystal with a three-dimensional shape tapered in a direction of deposition of a film, over the first semiconductor layer, by reducing a flow ratio of the dilution gas to the semiconductor source gas as compared to the reaction gas used for the first semiconductor layer to deposit the film; forming a third semiconductor layer including an impurity element imparting a conductivity type opposite to the first semiconductor layer, over the second semiconductor layer; and forming a second electrode over the third semiconductor layer.

Another embodiment of the present invention is a method for manufacturing a photoelectric conversion device including the steps of forming a first electrode over a substrate; forming a first semiconductor layer of a microcrystalline semiconductor including an impurity element imparting one conductivity type over the first electrode; forming a second semiconductor layer including a crystal with a three-dimensional shape tapered in a direction of deposition of a film, over the first semiconductor layer, by introducing a semiconductor source gas and a dilution gas which are mixed in a mixing ratio at which an amorphous semiconductor can be formed and producing plasma to deposit the film and by setting a flow rate of the dilution gas to 1 time to 6 times a flow rate of the semiconductor source gas at an initial stage of the deposition, to deposit the film; forming a third semiconductor layer including an impurity element imparting a conductivity type opposite to the first semiconductor layer, over the second semiconductor layer; and forming a second electrode over the third semiconductor layer.

In the above structure, a silicon hydride gas, a silicon fluoride gas, or a silicon chloride gas can be used as the semiconductor source gas, and a hydrogen gas can be used as the dilution gas.

Note that in this specification, the term "photoelectric conversion layer" includes a layer which converts light into electricity and a semiconductor layer having an impurity element imparting one conductivity type which is bonded in order to form internal electric field.

According to one embodiment of the present invention, an amorphous semiconductor layer having a needle-like crystal is formed as a layer which converts light into electricity, whereby photoelectric conversion characteristics can be improved. Further, an amorphous semiconductor layer is deposited on a microcrystalline semiconductor layer by controlling the amount of dilution of a reaction gas, whereby a crystal with a three-dimensional tapered shape can be made to grow. In addition, a main portion which converts light into electricity is formed using an amorphous semiconductor layer; therefore, high productivity and low cost can be achieved and resources can be saved. Thus, a photoelectric conversion device with improved cost competitiveness can be provided.

BRIEF DESCRIPTION OF THE DRAWINGS

FIGS. 7A to 7C are cross-sectional views showing a manufacturing process of an integrated photoelectric conversion device.

FIGS. 11A and 11B are cross-sectional views showing a manufacturing process of an integrated photoelectric conversion device.

FIGS. 12A and 12B are cross-sectional views showing a manufacturing process of an integrated photoelectric conversion device.

DETAILED DESCRIPTION OF THE INVENTION

Embodiment

Figure 1:
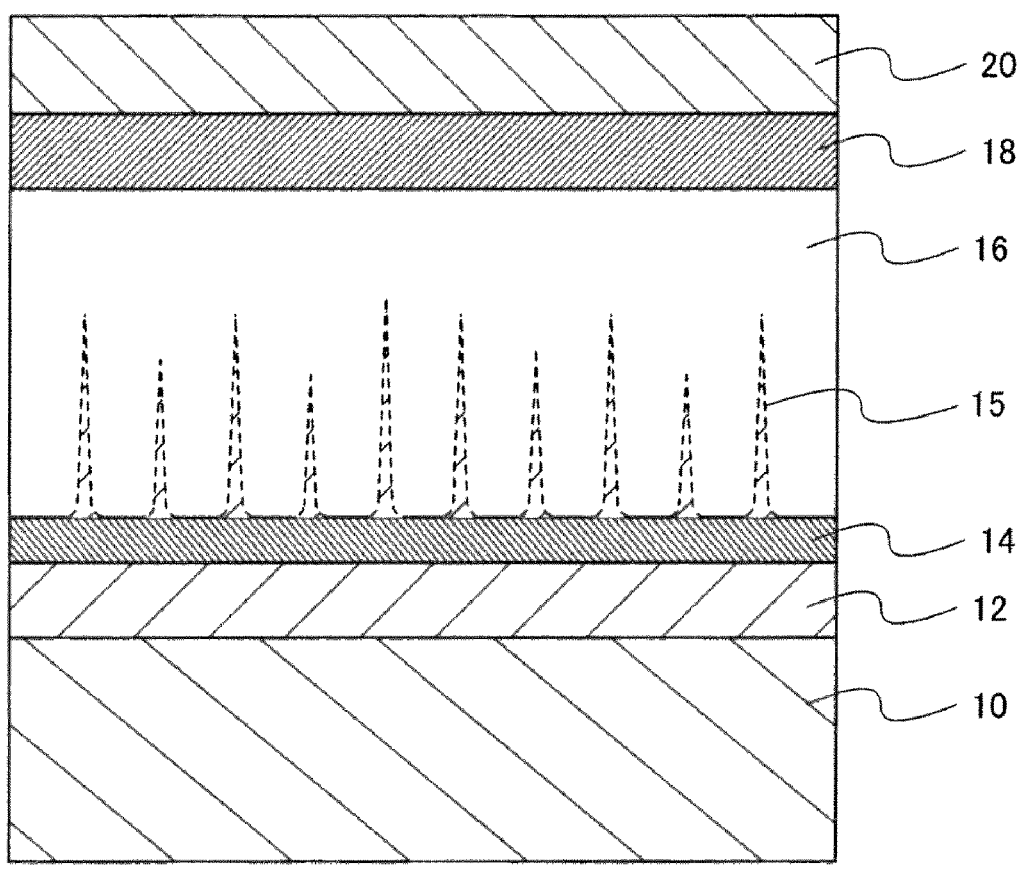
FIG. 1 is a diagram showing a photoelectric conversion device according to one embodiment of the present invention.

Embodiments of the present invention will be described with reference to the drawings. Note that the present invention is not limited to the following description, and it is easily understood by those skilled in the art that modes and details thereof can be modified in various ways without departing from the purpose and the scope of the invention. Thus, the present invention is not interpreted while limiting to the following description of the embodiments. Note that in the following description of the present invention, the same portion is denoted by the same reference numeral in different drawings.

Embodiment 1

FIG. 1 shows a structure of a photoelectric conversion device according to this embodiment. A photoelectric conversion device shown in FIG. 1 has a structure including a first electrode 12 provided over a substrate 10, a first semiconductor layer 14 provided over the first electrode 12, a second semiconductor layer 16 provided over the first semiconductor layer 14, a third semiconductor layer 18 provided over the second semiconductor layer 16, and a second electrode 20 provided over the third semiconductor layer 18. The second semiconductor layer 16 is interposed between the first semiconductor layer 14 and the third semiconductor layer 18. The first semiconductor layer 14 and the third semiconductor layer 18 have opposite polarities. One of the first semiconductor layer 14 and the third semiconductor layer 18 is formed using a p type semiconductor, and the other is formed using an n type semiconductor. The second semiconductor layer 16 is formed using an i type semiconductor. By employing such a structure, at least one semiconductor junction is included. Further, the first semiconductor layer 14 is formed using a microcrystalline semiconductor, and the second semiconductor layer 16 provided over the first semiconductor layer 14 is formed using an amorphous semiconductor. The third semiconductor layer 18 may be formed using either a microcrystalline semiconductor or an amorphous semiconductor. In this embodiment, an example is described in which the first semiconductor layer 14 is formed using a p type microcrystalline semiconductor, the second semiconductor layer 16 is formed using an i type amorphous semiconductor, and the third semiconductor layer 18 is formed using an n type microcrystalline semiconductor.

The second semiconductor layer 16 is a semiconductor layer formed over the first semiconductor layer 14. In the second semiconductor layer 16, a needle-like crystal 15 is present. The needle-like crystal 15 which is present in the second semiconductor layer 16 is a crystalline semiconductor in which crystal growth proceeds from the side of the first semiconductor layer 14 of a microcrystalline semiconductor. In an amorphous semiconductor region of the second semiconductor layer 16, a needle-like crystal of a crystalline semiconductor is present, and the needle-like crystal or a column-like crystal grows from the first semiconductor layer 14 side.

Here, in the second semiconductor layer 16, the needle-like crystal 15 has a three-dimensional shape or a planar shape which is tapered in a direction from the interface with the first semiconductor layer 14 of a microcrystalline semiconductor toward a surface of the second semiconductor layer 16 (on the side of the second semiconductor layer 16 which interfaces with the third semiconductor layer 18). The point of starting the growth of the needle-like crystal 15 is present on the first semiconductor layer 14 side, and the needle-like crystal 15 grows to be tapered in an in-plane direction perpendicular to a direction of crystal growth.

The second semiconductor layer 16 is formed over the first semiconductor layer 14. In specific, a semiconductor source gas and a dilution gas which are mixed in a mixing ratio at which an amorphous semiconductor can be formed are used as a reaction gas; the reaction gas is introduced into a reaction space; and pressure of a predetermined level is held to produce plasma, typically glow discharge plasma. Thus, a film (the second semiconductor layer 16) is deposited on a substrate (the substrate 10 provided with the first semiconductor layer 14) placed in the reaction space. Here, at the initial stage of the deposition of the second semiconductor layer 16, the flow rate of the dilution gas is set to 1 time to 6 times that of the semiconductor source gas (that is, the flow ratio of the semiconductor source gas to the dilution gas is set between 1:1 and 1:6 (sccm)). In a reaction gas at the initial stage of deposition of the second semiconductor layer 16, the flow rate of the dilution gas is set to 1 time to 6 times that of the semiconductor source gas to deposit the film. Thus, the needle-like crystal 15 grows in a direction of the deposition of the second semiconductor layer 16 from the first semiconductor layer 14 side. By controlling the amount of dilution of a reaction gas to deposit an amorphous semiconductor layer on a microcrystalline semiconductor layer, a needle-like crystal can be made to grow.

Further, the following is confirmed: in forming the second semiconductor layer 16, the film is deposited by reducing the flow ratio of a dilution gas to a semiconductor source gas as compared to a reaction gas used for deposition of the first semiconductor layer 14 of a microcrystalline semiconductor; thus, an amorphous semiconductor layer (the second semiconductor layer 16) having a needle-like crystal growing in a direction of the deposition of the film can be formed over the microcrystalline semiconductor layer. In specific, it is confirmed that an amorphous semiconductor layer having a needle-like crystal can be formed also in the case where the flow rate of the dilution gas is about 10 times, or 10 times or more that of the semiconductor source gas. Furthermore, the following is confirmed: a microcrystalline semiconductor is formed, and a film is deposited by gradually reducing the flow ratio of the dilution gas to the semiconductor source gas at the time of depositing the microcrystalline layer, whereby an amorphous semiconductor layer having a needle-like crystal growing in a direction of deposition of the film can be formed.

An amorphous semiconductor which forms the second semiconductor layer 16 is formed using amorphous silicon, amorphous germanium, or the like. In specific, the second semiconductor layer 16 can be formed with a plasma CVD apparatus with the use of a reaction gas obtained by diluting a semiconductor source gas typified by silane with a dilution gas typified by hydrogen. As the semiconductor source gas, silicon hydride typified by silane and disilane can be used. Note that instead of silicon hydride, silicon chloride such as $SiH_2Cl_2$, $SiHCl_3$, or $SiCl_4$, or silicon fluoride such as $SiF_4$ can be used. Hydrogen is a typical example of a dilution gas. The second semiconductor layer 16 can also be formed by dilution with a rare gas element of one kind or two or more kinds selected from helium, argon, krypton, and neon in addition to silicon hydride and hydrogen. As the second semiconductor layer 16, a film is deposited using a reaction gas in which the flow rate of hydrogen is 1 time to 6 times that of silicon hydride at the initial stage of deposition. Note that in depositing the second semiconductor layer 16, the flow rate of a dilution gas may be set to 1 time to 6 times that of a semiconductor source gas by the initial stage in which a needle-like crystal grows, and, as a reaction gas to be used after that, a semiconductor source gas and a dilution gas which are mixed in a mixing ratio at which an amorphous semiconductor can be formed may be used.

The second semiconductor layer 16 is formed using an i type semiconductor including the needle-like crystal 15. Note that the i type semiconductor in this specification is a semiconductor having a concentration of an impurity element imparting p type or n type conductivity of $1\times10^{20}/cm^3$ or lower and having a concentration of oxygen and nitrogen of $9\times10^{19}/cm^3$ or lower which are included in the semiconductor, and having photoconductivity 100 times or more as high as dark conductivity. An i type semiconductor may contain boron at 1 ppm to 1000 ppm. That is, there is a case where an i type semiconductor exhibits weak n type conductivity when an impurity element for controlling valence electrons is not added intentionally; so, in the case where an i type semiconductor is used for the second semiconductor layer 16, an impurity element imparting p type conductivity may be added concurrently with or after deposition. The impurity element imparting p type conductivity is typically boron, and an impurity gas such as $B_2H_6$ or $BF_3$ may be mixed into a semiconductor source gas at a ratio of 1 ppm to 1000 ppm. Concentration of boron may be $1\times10^{14}/cm^3$ to $6\times10^{16}/cm^3$.

Figure 4:
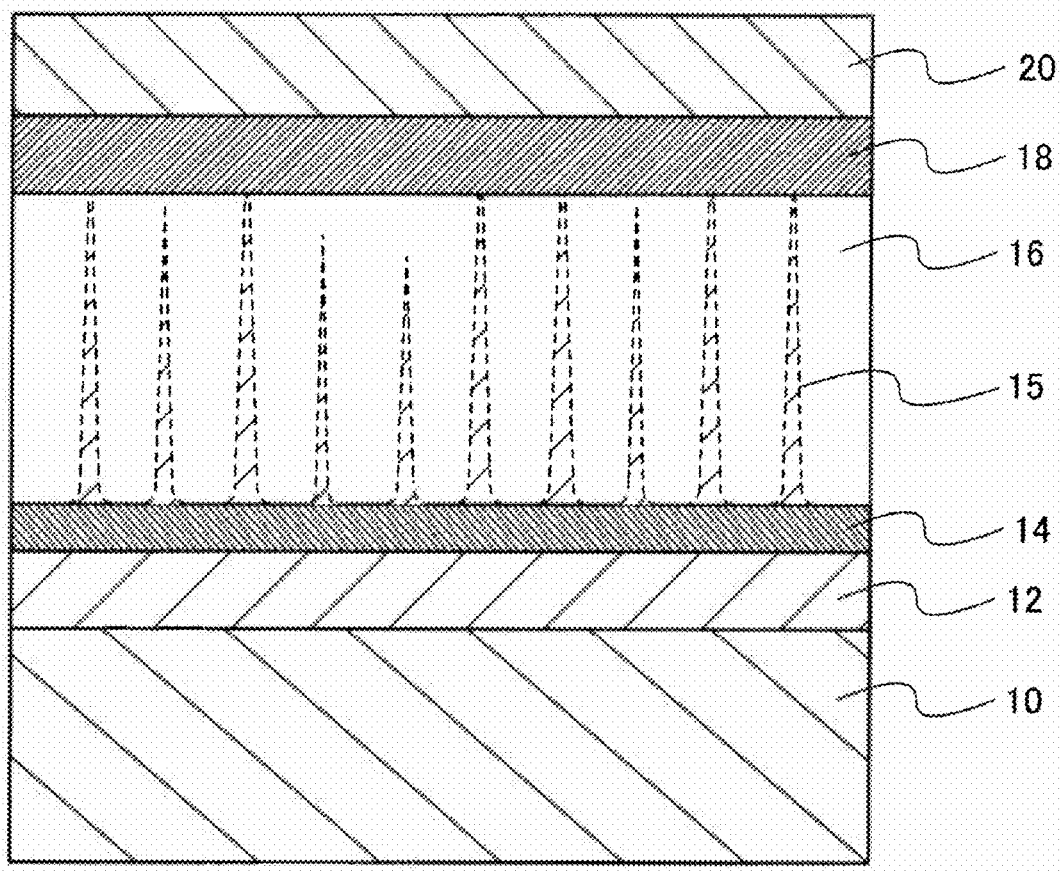
FIG. 4 is a diagram showing another mode of a photoelectric conversion device according to one embodiment of the present invention.

FIG. 1 illustrates an example in which the needle-like crystal 15 which is present in the second semiconductor layer 16 grows from the interface with the first semiconductor layer 14 to around the middle of the second semiconductor layer 16 in a deposition direction. For example, at the initial stage of deposition of the second semiconductor layer 16, the flow rate of a dilution gas is set to 1 time to 6 times that of a semiconductor source gas to deposit the film, whereby the needle-like crystal 15 is made to grow. In addition, at the stage where the needle-like crystal 15 is made to grow appropriately, the amount of the dilution gas is reduced or the dilution gas is halted, whereby crystal growth of the needle-like crystal 15 can be stopped. As shown in FIG. 4, the needle-like crystal 15 may be made to grow from the interface with the first semiconductor layer 14 so as to penetrate the interface with the third semiconductor layer 18.

Further, the following is confirmed: in forming the second semiconductor layer 16, the flow ratio of the dilution gas to the semiconductor source gas is gradually reduced as compared to a reaction gas used for deposition of the first semiconductor layer 14 to deposit the film, whereby the needle-like crystal 15 can be made to grow to the middle of the second semiconductor layer 16. For example, it is confirmed that a needle-like crystal can be made to grow by fixing the flow rate of a dilution gas used for a reaction gas and by gradually increasing the flow rate of a semiconductor source gas.

In the second semiconductor layer 16, a region of an amorphous semiconductor (specifically, amorphous silicon) is of a direct transition type and has a high light absorption coefficient. Therefore, photogenerated carriers are preferentially generated as compared to the needle-like crystal 15. In the second semiconductor layer 16, the region of an amorphous semiconductor (amorphous silicon) has a band gap of 1.6 eV to 1.8 eV, whereas the needle-like crystal 15 has a band gap of about 1.1 eV to 1.4 eV. Due to the relation, photogenerated carriers generated in the second semiconductor layer 16 flow in the needle-like crystal 15. Such a structure reduces the probability that a photogenerated carrier is trapped in a defect level of the second semiconductor layer 16. In addition, due to such a structure, photogenerated carriers flow in the needle-like crystal 15 even if a photoinduced defect is generated; therefore, high photoelectric conversion characteristics can be maintained. That is, property changes caused by photodegradation, which has been conventionally regarded as a problem, can be made small.

The first semiconductor layer 14 is an impurity semiconductor layer including an impurity element imparting one conductivity type. The first semiconductor layer 14 is formed over the first electrode 12 over the substrate 10. As the impurity element imparting one conductivity type, an impurity element imparting p type conductivity (typically, phosphorus, arsenic, or antimony, which is an element belonging to Group 15 in the periodic table) or an impurity element imparting p type conductivity (typically, boron or aluminum, which is an element belonging to Group 13 in the periodic table) is used. The first semiconductor layer 14 is formed using a microcrystalline semiconductor such as microcrystalline silicon, microcrystalline silicon germanium, or a microcrystalline germanium. In this embodiment, the first semiconductor layer 14 is formed using microcrystalline silicon including boron, which is an impurity element imparting p type conductivity.

The microcrystalline semiconductor in this specification is a layer including a semiconductor having an intermediate structure between amorphous and crystalline (including single-crystal and polycrystal) structures. The microcrystalline semiconductor is a semiconductor having a third state which is stable in terms of free energy. For example, the microcrystalline semiconductor is a layer including a semiconductor having the crystal grain size of equal to or greater than 2 nm and equal to or less than 200 nm, preferably greater than or equal to 10 nm and less than or equal to 80 nm, more preferably greater than or equal to 20 nm and less than or equal to 50 nm. A Raman spectrum of microcrystalline silicon, which is a typical example of a microcrystalline semiconductor, is shifted in lower wave numbers than 520 /cm, which represents a Raman spectrum of single crystal silicon. That is, the peak of a Raman spectrum of microcrystalline silicon is within the range from 520 /cm, which represents single crystal silicon, to 480 /cm, which represents amorphous silicon. The semiconductor includes hydrogen or halogen of at least 1 at. % or more to terminate a dangling bond. Moreover, microcrystalline semiconductor contains a rare gas element such as helium, argon, krypton, or neon to further promote lattice distortion, so that stability is increased and a favorable microcrystalline semiconductor can be obtained. Such a microcrystalline semiconductor has lattice distortion which changes the optical characteristics from the indirect transition of single crystal silicon into the direct transition. At least 10% of lattice distortion makes the optical characteristics change into the direct transition. When distortion exits locally, the optical characteristics in which the direct transition and the indirect transition are mixed can be obtained. Such description about the above-described microcrystalline semiconductor is disclosed in, for example, U.S. Pat. No. 4,409,134. In the present invention, the concept of the microcrystalline semiconductor is not fixed to only the above-described grain size; the microcrystalline semiconductor can be replaced with any other semiconductor material having a property value equivalent to the above value.

The first semiconductor layer 14 is formed using a semiconductor source gas and a dilution gas as a reaction gas which are mixed in a mixing ratio at which a microcrystalline semiconductor can be formed. In specific, a reaction gas in which a semiconductor source gas typified by silane is diluted with hydrogen or the like is introduced into a reaction space and pressure at a predetermined level is maintained to produce plasma, typically glow discharge plasma. Thus, as a film, the first semiconductor layer 14 is deposited on the substrate 10 provided with the first electrode 12 which is an object to be treated and is placed in the reaction space. As the semiconductor source gas and the dilution gas, a material similar to that used for deposition of the second semiconductor layer 16 can be used. That is, silicon hydride typified by silane or disilane, silicon fluoride, or silicon chloride and a dilution gas typified by hydrogen can be used, and further, a semiconductor source gas and a rare gas element of one kind or two or more kinds selected from helium, argon, krypton, and neon in addition to hydrogen can be used. The flow rate of the dilution gas (for example, hydrogen) is set to 5 times to 200 times, preferably 50 times to 150 times, more preferably 100 times that of the semiconductor source gas (for example, silicon hydride) to deposit the film, whereby the first semiconductor layer 14 is formed. For example, the first semiconductor layer 14 can be formed by diluting a semiconductor source gas typified by silane with hydrogen or the like and using glow discharge plasma, in a reaction chamber of a plasma CVD apparatus. The glow discharge plasma is produced by applying high-frequency power with a frequency of 1 MHz to 20 MHz, typically 13.56 MHz, or high-frequency power with a frequency of 20 MHz to about 120 MHz, typically 27.12 MHz or 60 MHz. A high-frequency power with a frequency of 1 GHz or more may be applied. A carbide gas such as $CH_4$ or $C_2H_6$ or a germanium gas such as $GeH_4$ or $GeF_4$ may be mixed into the semiconductor source gas so that the energy band width may be adjusted to be 1.5 eV to 2.4 eV or 0.9 eV to 1.1 eV.

The third semiconductor layer 18 is an impurity semiconductor layer which is formed over the second semiconductor layer 16 and includes an impurity element imparting one conductivity type. The third semiconductor layer 18 includes an impurity element imparting a conductivity type opposite to the first semiconductor layer 14 and is formed using a microcrystalline semiconductor or an amorphous semiconductor. In this embodiment, the third semiconductor layer 18 is formed using microcrystalline silicon including phosphorus, which is an impurity element imparting n type conductivity.

The substrate 10 can be formed using various commercially available glass plates such as soda-lime glass, opaque glass, lead glass, strengthened glass, and ceramic glass. Further, a non-alkali glass substrate such as an aluminoborosilicate glass substrate or a barium borosilicate glass substrate, a quartz substrate, or a metal substrate such as a stainless steel substrate can be used. In the case where the substrate 10 is used for a light incidence face (main light-receiving face), a light-transmitting substrate is used as the substrate 10. In the case where a main light-receiving face is on the substrate 10 side, the first electrode 12 is formed using a transparent conductive material such as indium oxide, an indium tin oxide alloy (ITO), or zinc oxide, and the second electrode 20 is formed using a conductive material such as aluminum, silver, titanium, or tantalum, preferably a metal material with which a reflective electrode can be formed. In contrast, in the case where a main light-receiving face is on the second electrode 20 side, the first electrode 12 is formed using a conductive material such as aluminum, silver, titanium, or tantalum, and the second electrode 20 is formed using a transparent conductive material. In the case where the first electrode 12 is made to serve as a reflective electrode by using a metal material such as aluminum, silver, titanium, or tantalum, it is preferable that the first electrode 12 have depressions and projections on a surface in contact with the first semiconductor layer 14 because reflectivity is improved.

As a transparent conductive material forming the first electrode 12 or the second electrode 20, a conductive high molecular material (also referred to as a conductive polymer) can be used instead of an oxide metal such as indium oxide, indium tin oxide, or zinc oxide. As the conductive high molecular material, $\pi$ electron conjugated conductive polymer can be used. For example, polyaniline and/or a derivative thereof, polypyrrole and/or a derivative thereof, polythiophene and/or a derivative thereof, and a copolymer of two or more kinds of those materials can be given as the $\pi$ electron conjugated conductive polymer.

FIG. 1 illustrates the structure of the photoelectric conversion layer including a PIN junction using a stacked structure of the first semiconductor layer 14, the second semiconductor layer 16, and the third semiconductor layer 18. However, a PI junction, an IN junction, and a PN junction may be used as semiconductor junctions that form the photoelectric conversion layer, in addition to the PIN junction.

Figure 2:
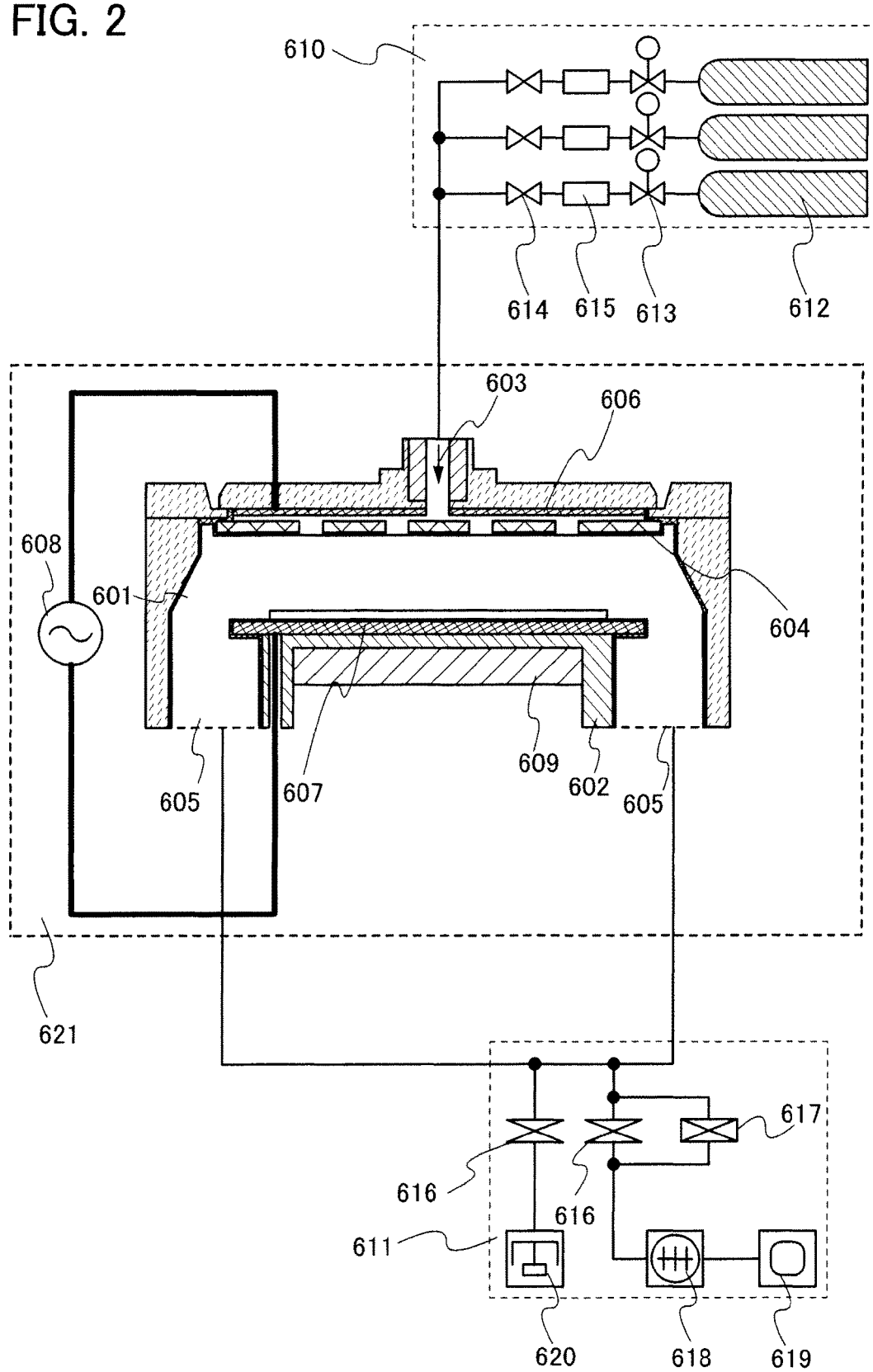
FIG. 2 is a diagram of a plasma CVD apparatus which can be used for manufacturing a photoelectric conversion device according to one embodiment of the present invention.

Here, FIG. 2 is a schematic view of a plasma CVD apparatus used for forming a semiconductor layer included in a photoelectric conversion device according to this embodiment.

A plasma CVD apparatus 621 shown in FIG. 2 is connected to a gas supplying means 610 and an exhaust means 611.

The plasma CVD apparatus 621 shown in FIG. 2 is provided with a reaction chamber 601, a stage 602, a gas supply portion 603, a shower plate 604, an exhaust port 605, an upper electrode 606, a lower electrode 607, an AC power source 608, and a temperature control portion 609.

The reaction chamber 601 is formed using a material having rigidity and is structured to allow vacuum evacuation inside the reaction chamber 601. The reaction chamber 601 is provided with the upper electrode 606 and the lower electrode 607. Although FIG. 2 shows the structure of a capacitive coupling type (parallel plate type), another structure such as an inductive coupling type may be employed as long as plasma can be produced inside the reaction chamber 601 by applying two or more different high-frequency electric powers.

When treatment is performed with the plasma CVD apparatus shown in FIG. 2, a given gas is supplied through the gas supply portion 603. The supplied gas is introduced into the reaction chamber 601 through a shower plate 604. High-frequency power is applied by the AC power source 608 connected to the upper electrode 606 and the lower electrode 607 to excite the gas in the reaction chamber 601, thereby producing plasma. Further, the gas in the reaction chamber 601 is exhausted through the exhaust port 605 that is connected to a vacuum pump. With the temperature control portion 609, plasma treatment can be performed with an object to be treated heated.

The gas supply means 610 includes a cylinder 612 filled with a reaction gas, a pressure regulator valve 613, a stop valve 614, a mass flow controller 615, and the like. In the reaction chamber 601, the shower plate 604 which is processed in a plate shape and is provided with a plurality of minute pores is included between the upper electrode 606 and the lower electrode 607. A reaction gas that is supplied to the upper electrode 606 passes through an inner hollow portion, and is supplied to the reaction chamber 601 through the minute pores.

An exhaust means 611 that is connected to the reaction chamber 601 has a function of vacuum evacuation and a function of controlling the pressure inside the reaction chamber 601 to be maintained at a predetermined level when a reaction gas is introduced. The evacuation means 611 includes a butterfly valve 616, a conductance valve 617, a turbo molecular pump 618, a dry pump 619, and the like. When the butterfly valve 616 and the conductance valve 617 are provided in parallel, exhaust velocity of a reaction gas can be controlled to maintain pressure in the reaction chamber 601 in a predetermined range by closing the butterfly valve 616 to operate the conductance valve 617. Moreover, to open the butterfly valve 616 having higher conductance makes it possible to perform high-vacuum evacuation.

Note that in the case where the reaction chamber 601 is subjected to ultra-high vacuum evacuation to the pressure lower than $10^{-5}$ Pa, it is preferable to use a cryopump 620 together. Alternatively, when exhaust is performed to ultra-high vacuum as ultimate vacuum, the inner wall of the reaction chamber 601 is polished into a mirror surface, and the reaction chamber 601 may be provided with a heater for baking in order to reduce deflation from the inner wall.

Note that by performing pre-coating treatment so that a film is formed to cover the inner wall of the reaction chamber 601 entirely as shown in FIG. 2, mixture of an impurity element attached to the inner wall of the reaction chamber or an impurity element forming the inner wall of the reaction chamber can be prevented.

Figure 3:
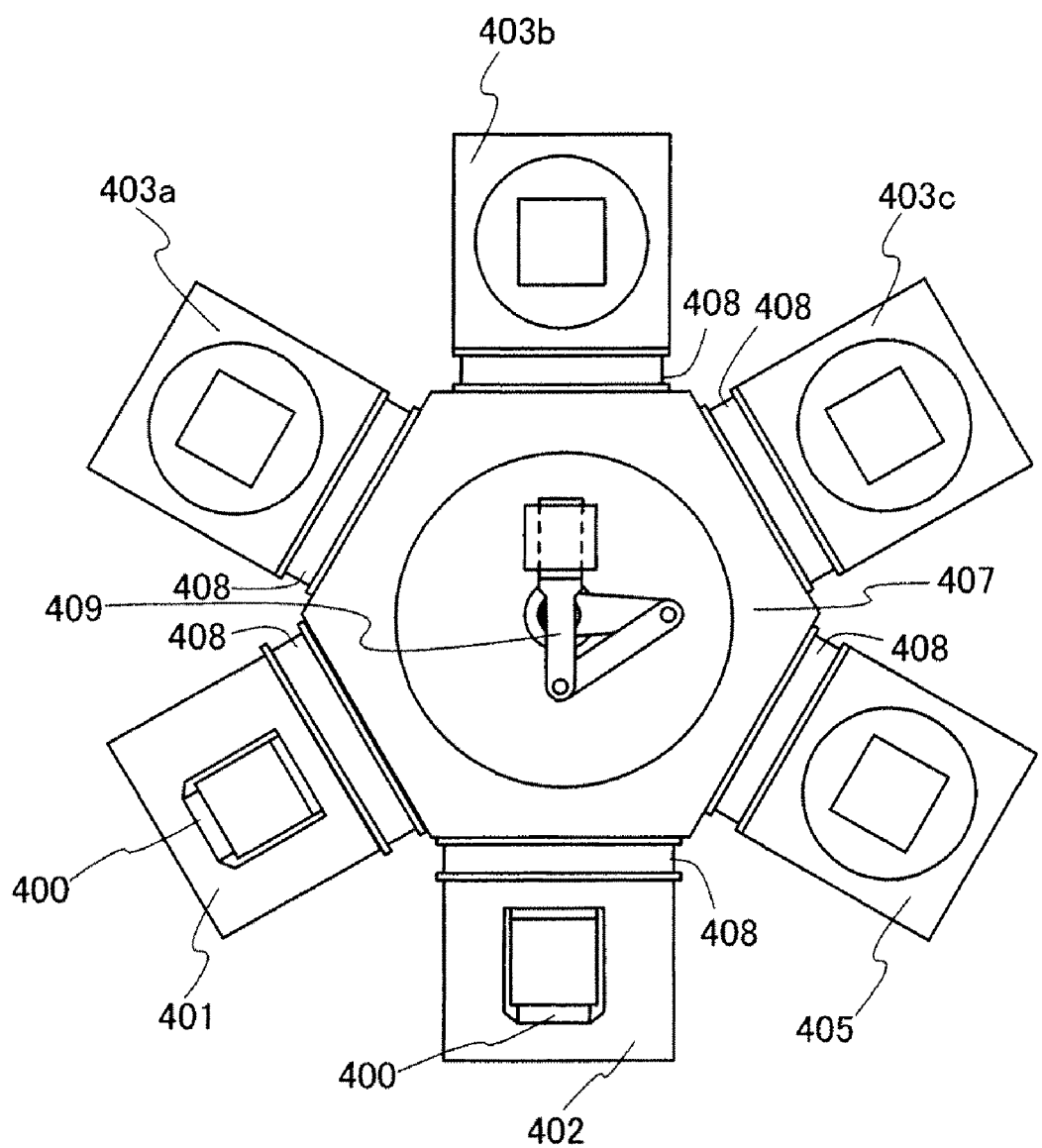
FIG. 3 is a diagram showing a structure of a multi-chamber plasma CVD apparatus provided with a plurality of reaction chambers.

Note that the plasma CVD apparatus shown in FIG. 2 can have a multi-chamber structure as shown in FIG. 3. The apparatus shown in FIG. 3 includes a load chamber 401, an unload chamber 402, a reaction chamber (1) 403a, a reaction chamber (2) 403b, a reaction chamber (3) 403c, and a spare chamber 405 around a common chamber 407. A p type semiconductor layer is deposited in the reaction chamber (1) 403a, and an i type semiconductor layer is deposited in the reaction chamber (2) 403b. An n type semiconductor layer is deposited in the reaction chamber (3) 403c. An object to be treated is transferred to each reaction chamber through the common chamber 407. A gate valve 408 is provided between the common chamber 407 and each chamber such that treatment performed in each reaction chamber do not interfere each other. The substrate is placed in a cassette 400 provided in each of the load chamber 401 and the unload chamber 402 and transferred to the reaction chamber (1) 403a, the reaction chamber (2) 403b, and the reaction chamber (3) 403c by a transfer means 409 of the common chamber 407. In this apparatus, a reaction chamber can be provided in accordance with types of films to be deposited, and a plurality of different kinds of films can be formed in succession without being exposed to the atmospheric air.

A reaction gas is introduced into the reaction chamber (reaction space) of a plasma CVD apparatus having the structure as shown in FIG. 2 and FIG. 3 and plasma is produced, whereby the first semiconductor layer 14, the second semiconductor layer 16, and the third semiconductor layer 18 can be formed.

In the case where the photoelectric conversion device having a PIN structure is formed, it is preferable to provide reaction chambers corresponding to deposition of semiconductor layers, namely a layer of p type, a layer of i type, and a layer of n type in a plasma CVD apparatus.

In this case, first, the substrate 10 provided with the first electrode 12 is used as an object to be treated, and a first reaction gas is introduced into the reaction chamber (1) to which the object to be treated is transferred and plasma is produced to form the first semiconductor layer 14 (p type impurity semiconductor layer) over the first electrode 12 formed over the substrate 10. Then, the substrate 10 provided with the first semiconductor layer 14 is then transferred from the reaction chamber (1) without being exposed to the atmosphere and the substrate 10 is moved to the reaction chamber (2). A second reaction gas is introduced into the reaction chamber (2) and plasma is produced to form the second semiconductor layer 16 (i type semiconductor layer) over the first semiconductor layer 14. The substrate 10 provided with the second semiconductor layer 16 is then transferred from the reaction chamber (2) without being exposed to the atmosphere and the substrate 10 is moved to the reaction chamber (3). A third reaction gas is introduced into the reaction chamber (3) and plasma is produced to form the third semiconductor layer 18 (n type semiconductor layer) over the second semiconductor layer 16. FIG. 3 illustrates the case of including three reaction chambers in accordance with the number of layers to be stacked (the first semiconductor layer 14, the second semiconductor layer 16, and the third semiconductor layer 18).

For example, when a PI junction, an IN junction, or a PN junction is formed as a photoelectric conversion layer, the number of treatment chambers for depositing semiconductor layers may be two. Alternatively, when a structure of layers is applied in which concentrations of an impurity imparting one conductivity type are different from each other, as the case of a PP$^-$N junction or a P$^+$PP$^-$N junction, four reaction chambers may be used. On the other hand, two treatment chambers are sufficient in some cases because the concentration of gases including impurity elements to be introduced into the reaction chambers may be controlled.

Embodiment 2

In this embodiment, an example of a so-called integrated photoelectric conversion device is described, in which a plurality of unit cells is formed over one substrate and is connected in series to integrate a photoelectric conversion device. Hereinafter, a manufacturing process and a structure of an integrated photoelectric conversion device are described.

Figure 5:
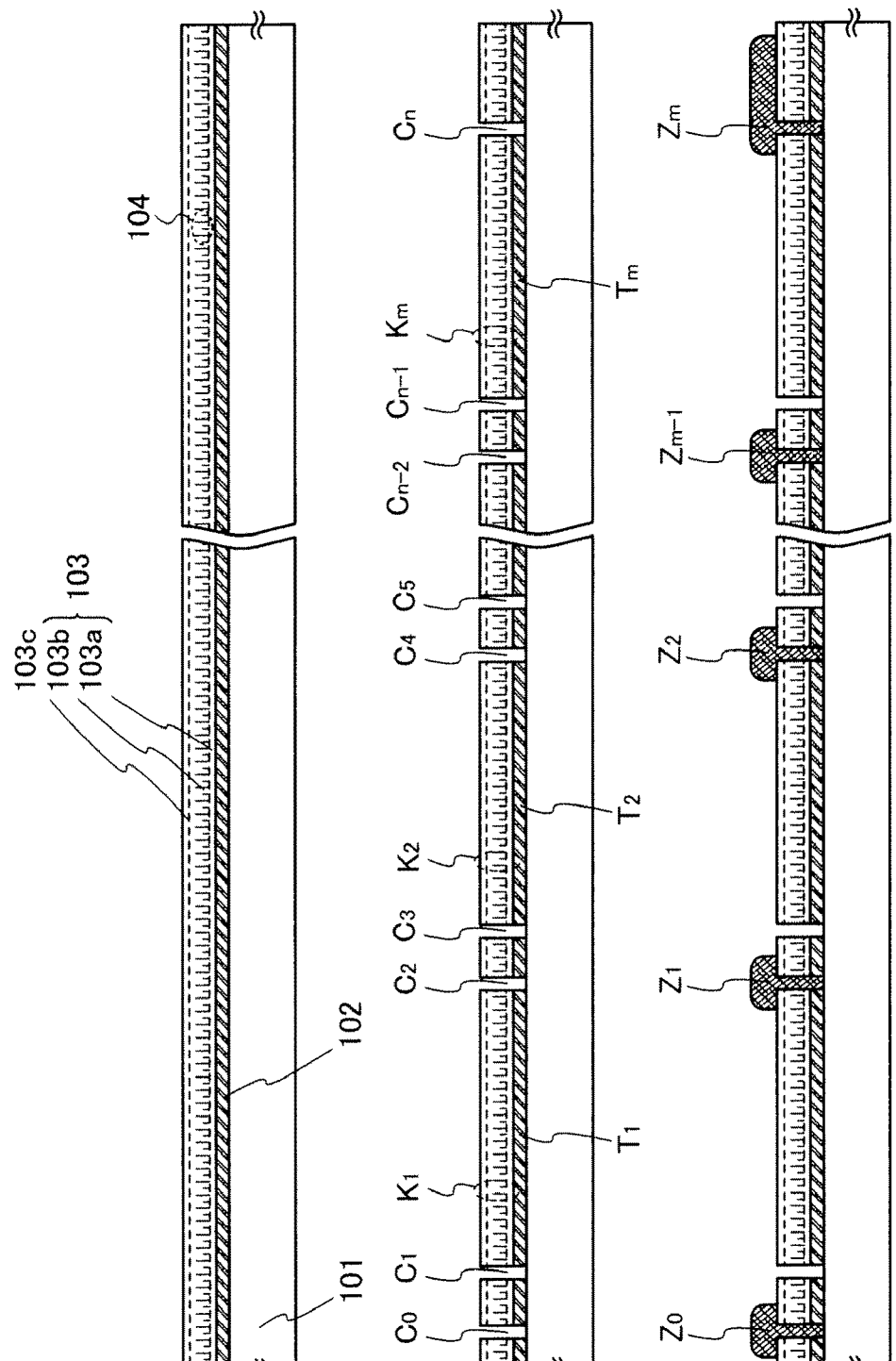
FIGS. 5A to 5C are cross-sectional views showing a manufacturing process of an integrated photoelectric conversion device.

In FIG. 5A, a first electrode layer 102 is provided over a substrate 101. Alternatively, a substrate 101 provided with a first electrode layer 102 is prepared. The first electrode layer 102 is formed to a thickness of 40 nm to 200 nm (preferably, 50 nm to 100 nm) using a transparent conductive material such as indium oxide, an indium tin oxide alloy, zinc oxide, tin oxide, or indium tin oxide-zinc oxide alloy. The sheet resistance of the first electrode layer 102 may be about 20 Ω/square to 200 Ω/square.

The first electrode layer 102 can be formed using a conductive high molecular material (also referred to as a conductive polymer). When a thin film is formed using a conductive high molecular material as the first electrode layer 102, the thin film preferably has a sheet resistance of lower than or equal to 10000 Ω/square and a light transmittance of lower than or equal to 70% with respect to light with a wavelength of 550 nm. In addition, it is preferable that the resistivity of the conductive high molecule contained in the first electrode layer 102 be 0.1 Ω·cm or lower. As the conductive high molecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly N-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the foregoing conductive high molecules may be used alone as a conductive high molecular material for the first electrode layer 102. Alternatively, any of the foregoing conductive high molecules can be used with an organic resin added thereto to adjust characteristics of the conductive high molecular material.

As for an organic resin which adjusts characteristics of the conductive high molecular material, any of a thermosetting resin, a thermoplastic resin, or a photocurable resin may be used as long as such resin is compatible with a conductive high molecule or such resin can be mixed and dispersed into a conductive high molecule. For example, a polyester-based resin such as polyethylene terephthalate, polybutylene terephthalate, or polyethylene naphthalate; a polyimide-based resin such as polyimide or polyamide-imide; a polyamide resin such as polyamide 6, polyamide 66, polyamide 12, or polyamide 11; a fluorine resin such as polyvinylidene fluoride, polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins can be used.

Further, in order to adjust electric conductivity of the first electrode layer 102, an oxidation-reduction potential of a conjugated electron in a conjugated conductive high molecule may be changed by adding an impurity to be an acceptor or an impurity to be a donor to a conductive high molecular material.

As the impurity to be an acceptor, a halogen compound, a Lewis acid, a protonic acid, an organic cyano compound, an organic metal compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound in which two or more cyano groups are included in a conjugated bond can be used. For example, tetracyanoethylene, tetracyanoethylene oxide, tetracyanobenzene, tetracyanoquinodimethane, tetracyanoazanaphthalene, and the like are given.

As the impurity to be a donor, an alkali metal, an alkaline earth metal, a tertiary amine compound, and the like can be given.

Further, a thin film used for the first electrode layer 102 can be formed by a wet process using a solution in which the conductive high molecule is dissolved in water or an organic solvent (e.g., an alcohols solvent, a ketones solvent, an esters solvent, a hydrocarbons solvent, or an aromatics solvent). The solvent for dissolving the conductive high molecule is not particularly limited. A solvent which dissolves the above-described conductive high molecule and polymer resin compound of an organic resin or the like may be used. For example, the conductive high molecule may be dissolved in any one or a mixture of water, methanol, ethanol, propylene carbonate, N-methylpyrrolidone, dimethylformamide, dimethylacetamide, cyclohexanone, acetone, methyl ethyl ketone, methyl isobutyl ketone, toluene, or the like.

After the conductive high molecular material is dissolved in a solvent as described above, a film thereof can be deposited by a wet process such as an application method, a coating method, a droplet discharge method (also referred to as an inkjet method), or a printing method. The solvent may be dried with thermal treatment or may be dried with thermal treatment under a reduced pressure. In the case where the organic resin added to the conductive high molecular material is a thermosetting resin, heat treatment may be performed further. In the case where the organic resin is a photocurable resin, light irradiation treatment may be performed.

Further, the first electrode layer 102 can be formed using a transparent conductive material that is a composite material including an organic compound and an inorganic compound showing an electron accepting property with respect to the organic compound. In this composite material, by composite of a first organic compound and second inorganic matter showing an electron accepting property with respect to the first organic compound, resistivity can be $1 \times 10^6$ $\Omega \cdot$cm or less. Note that "composite" does not only means that a plurality of materials is simply mixed but also means that charges are given and received between the materials by mixture of a plurality of materials.

As the organic compound used for the composite material, various compounds such as an aromatic amine compound, a carbazole derivative, an aromatic hydrocarbon, and a high molecular compound (oligomer, dendrimer, polymer, or the like) can be used. The organic compound used for the composite material is preferably an organic compound having a high hole transporting property. Specifically, it is preferable to use a substance having a hole mobility of higher than or equal to $10^{-6}$ cm$^2$/Vsec. Note that a substance other than that described above may be used as long as it has a property of transporting holes rather than electrons.

Specifically, as the organic compound which can be used for the composite material, examples of organic compounds described below can be used. For example, 4,4'-bis[N-(1-naphtyl)-N-phenylamino]biphenyl (abbreviation: NPB), 4,4'-bis[N-(3-methylphenyl)-N-phenylamino]biphenyl (abbreviation: TPD), 4,4',4"-tris(N-diphenylamino)triphenylamine (abbreviation: TDATA), or 4,4',4"-tris[N-(3-methylphenyl)-N-phenylamino]triphenylamine (abbreviation: MTDATA) can be given.

When the following organic compounds are used as an organic compound, a composite material that does not have a peak of an absorption spectrum in a wavelength region of 450 nm to 800 nm can be obtained. At the same time, resistivity can be $1 \times 10^6$ $\Omega \cdot$cm or lower, typically, $5 \times 10^4$ $\Omega \cdot$cm to $1 \times 10^6$ $\Omega \cdot$cm.

As the composite material that does not have a peak of an absorption spectrum in a wavelength region of 450 nm to 800 nm, aromatic amine compounds such as N,N'-di(p-tolyl)-N, N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); and 1,3,5-tris[N-(4-diphenylaminophenyl)-N-phenylamino]benzene (abbreviation: DPA3B) can be given.

Further, as the composite material that does not have a peak of an absorption spectrum in a wavelength region of 450 nm to 800 nm, carbazole derivatives such as 3-[N-(9-phenylcarbazol-3-yl)-N-phenylamino]-9-phenylcarbazole (abbreviation PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); and the like can be given. Furthermore, carbazole derivatives such as 4,4'-di(N-carbazolyl)biphenyl (abbreviation: CBP); 1,3,5-tris[4(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; and the like can be given.

Still furthermore, as the composite material that does not have a peak of an absorption spectrum in a wavelength region of 450 nm to 800 nm, aromatic hydrocarbons such as 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1- yl)anthracene; 2,3,6,7-tetramethyl-9,10-di(naphthalen-2-yl) anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like can be given. In addition, pentacene, coronene, or the like can also be used. As these aromatic hydrocarbons listed here, an aromatic hydrocarbon having hole mobility of $1\times10^{-6}$ cm$^2$/Vsec or more and having 14 to 42 carbon atoms is preferably used.

An aromatic hydrocarbon that can be used for the composite material that does not have an absorption peak in a wavelength region of 450 nm to 800 nm may have a vinyl skeleton. As the aromatic hydrocarbon having a vinyl group, 4,4'-bis (2,2-diphenylvinyl)biphenyl (abbreviation: DPVBi); 9,10-bis[4-(2,2-diphenylvinyl)phenyl]anthracene (abbreviation: DPVPA); and the like can be given, for example.

Moreover, a high molecular compound such as poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA) can also be used.

As the inorganic compound used for the composite material, an oxide of a transition metal is preferably used. Moreover, an oxide of a metal element belonging to any of Groups 4 to 8 in the periodic table is preferable. Specifically, vanadium oxide, niobium oxide, tantalum oxide, chromium oxide, molybdenum oxide, tungsten oxide, manganese oxide, and rhenium oxide are preferable because of a high electron accepting property. Above all, molybdenum oxide is particularly preferable because it is stable in the air, easily treated, and has low moisture absorption properties.

A method for manufacturing the first electrode layer 102 in which the composite material is used may be either a wet method or a dry method, and any method may be used. For example, the first electrode layer 102 in which the composite material is used can be manufactured by co-evaporation of the above organic compound and inorganic compound. Note that when the first electrode layer 102 is formed using molybdenum oxide, it is preferable to form the first electrode layer 102 by an evaporation method from an aspect of the manufacturing process because molybdenum oxide is easily evaporated in vacuum. Further, the first electrode layer 102 can also be manufactured by applying and baking a solution containing the aforementioned organic compound and metal alkoxide. As an application method, an ink-jet method, a spin-coating method, or the like can be used.

By selecting the kind of the organic compound contained in the composite material which is used for the first electrode layer 102, a composite material that does not have a peak of an absorption spectrum in a wavelength region of 450 to 800 nm can be obtained. Therefore, light such as sunlight can be transmitted efficiently without absorption, whereby light collection efficiency can be improved. Further, by forming the first electrode layer 102 using a composite material, enhanced flexibility can be obtained. Therefore, in the case where a photoelectric conversion device is manufactured using a flexible substrate, the first electrode layer 102 is preferably formed using a composite material.

In terms of reducing resistance of the first electrode layer 102, it is preferable to use ITO. In this case, in order to prevent deterioration of the ITO, it is effective that a SnO$_2$ film or a ZnO film be formed over the ITO. A ZnO (ZnO:Ga) film containing 1 to 10 wt % of gallium has high transmissivity and is a favorable material to be stacked over the ITO film. As an example of a combination, an ITO film is formed to a thickness of 50 nm to 60 nm and a ZnO: Ga film is formed to 25 nm over the ITO film to form the first electrode layer 102. Thus, a favorable light transmissive property can be obtained. A sheet resistance of 120 to 150 Ω/square is obtained in the stacked film of an ITO film and a ZnO:Ga film.

A photoelectric conversion layer 103 is formed using a microcrystalline semiconductor or an amorphous semiconductor which is manufactured by a plasma CVD method. A typical example of a microcrystalline semiconductor is microcrystalline silicon manufactured using a reaction gas in which a SiH$_4$ gas is diluted with a hydrogen gas, and alternatively, microcrystalline silicon germanium or microcrystalline silicon carbide is used. A typical example of an amorphous semiconductor is amorphous silicon manufactured using a SiH$_4$ gas as a reaction gas, and alternatively, amorphous silicon carbide or amorphous silicon germanium is used. The photoelectric conversion layer 103 includes any semiconductor junction of a PIN junction, a PI junction, an IN junction, or a PN junction.

FIG. 5A shows an example of the photoelectric conversion layer 103 having a structure in which a first semiconductor layer 103a formed using a p type microcrystalline semiconductor, a second semiconductor layer 103b formed using an i type amorphous semiconductor, and a third semiconductor layer 103c formed using an n type microcrystalline semiconductor are stacked from the first electrode layer 102 side. The thickness of the photoelectric conversion layer 103 is 0.5 μm to 10 μm, preferably 1 μm to 5 μm. Further, in the photoelectric conversion layer 103, the thickness of the first semiconductor layer 103a can be 10 nm to 20 nm and the thickness of the third semiconductor layer 103c can be 20 nm to 60 nm.

In the second semiconductor layer 103b formed over the first semiconductor layer 103a, a needle-like crystal 104 is present which grows from the interface with the first semiconductor layer 103a toward the interface with the third semiconductor layer 103c. The first semiconductor layer 103a is formed using a microcrystalline semiconductor, and, in a reaction gas at the initial stage of deposition of the second semiconductor layer 103b, the flow rate of a dilution gas is set to 1 time to 6 times that of a semiconductor source gas to form an amorphous semiconductor, whereby the needle-like crystal 104 can be made to grow in a direction of deposition of the second semiconductor layer 103b from the first semiconductor layer 103a side.

Further, the following is confirmed: in forming the second semiconductor layer 103b, the flow ratio of a dilution gas to a semiconductor source gas is reduced as compared to a reaction gas used for deposition of the first semiconductor layer 103a to deposit a film; thus, an amorphous semiconductor layer having the needle-like crystal 104 growing in a direction of deposition of the second semiconductor layer 103b from the first semiconductor layer 103a side can be formed. Furthermore, the following is confirmed: a film is deposited by gradually reducing the flow ratio of the dilution gas to the semiconductor source gas as compared to a reaction gas used for deposition of the first semiconductor layer 103a, whereby an amorphous semiconductor layer having the needle-like crystal 104 growing in a direction of deposition of the second semiconductor layer 103b from the first semiconductor layer 103a side can be formed.

In the state where the first semiconductor layer 103a, the second semiconductor layer 103b, and the third semiconductor layer 103c are stacked or at the stage in which the first semiconductor layer 103a and the second semiconductor layer 103b are stacked, treatment for improving crystallinity may be performed by irradiating these semiconductor layers with a laser beam. A laser beam with which the semiconductor layers are irradiated can be ultraviolet light, visible light, or infrared light. As a laser capable of emitting ultraviolet light, visible light, or infrared light, an excimer laser using KrF, ArF, XeCl, Xe, or the like; a gas laser using He, He—Cd, Ar, $HE_m$e, HF, or the like; a solid-state laser in which a crystal of YAG, $GdVO_4$, $YVO_4$, YLF, $YAlO_3$, or the like is doped with Cr, Nd, Er, Ho, Ce, Co, Ti, or $T_m$; a semiconductor laser using GaN, GaAs, GaAlAs, InGaAsP, or the like; a diode laser; or the like can be used. Typically, a laser beam with a wavelength of 400 nm or less which is emitted from an excimer laser, or a second harmonic or a third harmonic of a YAG laser can be used. For example, a pulse laser with a repetition rate of approximately 10 Hz to 1000 Hz is used, and the laser beam emitted from the pulse laser is concentrated to be 100 mJ/cm$^2$ to 500 mJ/cm$^2$ with an optical system and is delivered to scan a surface of the semiconductor layer with an overlap rate of 90% to 95%. Furthermore, as a solid-state laser capable of continuous oscillation, a second harmonic, a third harmonic, or a fourth harmonic is preferably used. Typically, a second harmonic (532 nm) or a third harmonic (355 nm) of an Nd:$YVO_4$ laser (the fundamental wavelength is 1064 nm) may be used. In the case of using a continuous wave laser, a laser beam which is emitted from a continuous wave $YVO_4$ laser of 10 W output is converted into a harmonic by a non-linear optical element. The harmonic may also be emitted by setting a $YVO_4$ crystal and a non-linear optical element in a resonator. Then, the laser beam having a rectangular shape or an elliptical shape on an irradiated face is preferably formed by an optical system, and the semiconductor layer which is an object to be irradiated is irradiated with the laser light. The power density is necessary to be approximately 0.01 MW/cm$^2$ to 100 MW/cm$^2$ (preferably, 0.1 MW/cm$^2$ to 10 MW/cm$^2$). Then, the semiconductor layer which is an object to be treated is preferably moved at a speed of approximately 10 cm/s to 2000 cm/s relative to the laser beam.

As shown in FIG. 5B, in order to form a plurality of unit cells over one substrate, openings $C_0$ to $C_n$ which penetrate the photoelectric conversion layer 103 and the first electrode layer 102 are formed by a laser processing method. The openings $C_0$, $C_2$, $C_4$, ... $C_{n-2}$, and $C_n$ are openings for insulating and separating unit cells. The openings are provided to form a plurality of unit cells in which element isolation is performed. Further, the openings $C_1$, $C_3$, $C_5$, ... and $C_{n-1}$ are provided to form connections between separated first electrodes and second electrodes to be formed later over the photoelectric conversion layer 103. By formation of the openings $C_0$ to $C_n$, the first electrode layer 102 is divided into first electrodes $T_1$ to $T_m$, and the photoelectric conversion layer 103 is divided into photoelectric conversion layers $K_1$ to $K_m$. The kind of lasers used in a laser processing method for forming the openings is not limited, but a Nd-YAG laser, an excimer laser, or the like is preferably used. In any case, by performing laser processing in a state where the first electrode layer 102 and the photoelectric conversion layer 103 are stacked, separation of the first electrode layer 102 from the substrate 101 during processing can be prevented.

As shown in FIG. 5C, insulating resin layers $Z_0$ to $Z_m$ with which the openings $C_0$, $C_2$, $C_4$, ... $C_{n-2}$, and $C_n$ are filled and which cover upper end portions of the openings $C_0$, $C_2$, $C_4$, ... $C_{n-2}$, and $C_n$ are formed. The insulating resin layers $Z_0$ to $Z_m$ may be formed using a resin material having an insulating property such as an acrylic-based resin, a phenol-based resin, an epoxy-based resin, or a polyimide-based resin by a screen printing method. For example, insulating resin patterns are formed using a resin composition in which cyclohexane, isophorone, high resistance carbon black, aerosil, dispersant, a defoaming agent, and a leveling agent are mixed with a phenoxy resin by a screen printing method so that the openings $C_0$, $C_2$, $C_4$, ... $C_{n-2}$, and $C_n$ are filled. After the insulating resin patterns are formed, thermal hardening is performed in an oven at 160° C. for 20 minutes to obtain the insulating resin layers $Z_0$ to $Z_m$.

Figure 6:
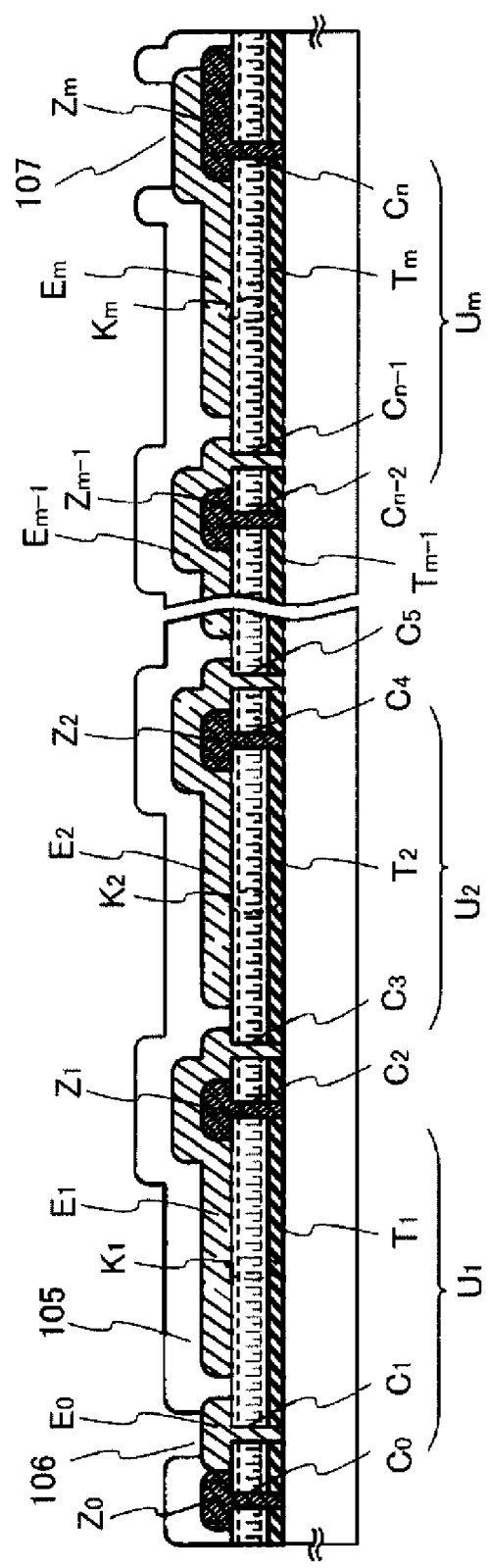
FIG. 6 is a cross-sectional view showing a manufacturing process of an integrated photoelectric conversion device.

Next, second electrodes $E_0$ to $E_m$ shown in FIG. 6 are formed. The second electrodes $E_0$ to $E_m$ are formed using a conductive material. The second electrodes $E_0$ to $E_m$ may be formed using a conductive layer formed of aluminum, silver, molybdenum, titanium, chromium, or the like by a sputtering method or a vacuum evaporation method. Alternatively, the second electrodes $E_0$ to $E_m$ can be formed using a conductive material which can be discharged. In the case where the second electrodes $E_0$ to $E_m$ are formed using a conductive material which can be discharged, predetermined patterns are directly formed by a screen printing method, an ink-jet method (droplet discharge method), a dispenser method, or the like. For example, the second electrodes $E_0$ to $E_m$ can be formed using a conductive material containing conductive particles of metal such as Ag (silver), Au (gold), Cu (copper), W (tungsten), or Al (aluminum). In the case of manufacturing a photoelectric conversion device using a large-area substrate, the resistance of each of the second electrodes $E_0$ to $E_m$ is preferably made low. Therefore, a conductive material may be used in which particles of any of gold, silver, or copper which has low specific resistance, preferably silver or copper which has low resistance are dissolved or dispersed in a solvent as particles of metal. Further, in order to sufficiently fill the openings $C_1$, $C_3$, $C_5$, ... $C_{n-1}$ which are subjected to laser processing with a conductive material, nanopaste with an average grain size of conductive particles of 5 nm to 10 nm is preferably used.

Alternatively, the second electrodes $E_0$ to $E_m$ may be formed by discharging a conductive material containing conductive particles in each of which a conductive material is covered with another conductive material. For example, as a conductive particle formed of Cu whose periphery is covered with Ag, a conductive particle provided with a buffer layer formed of Ni or NiB (nickel boron) between Cu and Ag may be used. As the solvent, esters such as butyl acetate, alcohols such as isopropyl alcohol, or an organic solvent such as acetone is used. The surface tension and viscosity of the conductive material which is discharged are appropriately adjusted by controlling concentration of a solution and adding a surface active agent or the like.

A diameter of a nozzle used for an ink-jet method is preferably 0.02 μm to 100 μm (more preferably, equal to or less than 30 μm), and the amount of the conductive material discharged from the nozzle is preferably 0.001 pl to 100 pl (more preferably, equal to or less than 10 pl). Although the ink-jet method has two types that are an on-demand type and a continuous type, both types may be used. Furthermore, a nozzle used for an ink-jet method has a piezoelectric method utilizing a property in which a piezoelectric substance is transformed by voltage application and a heating method in which an object to be discharged (here, a conductive material) is boiled by a heater provided in the nozzle to be discharged, and both methods may be used. It is preferable that a distance between an object to be treated and a discharging opening of the nozzle be as short as possible in order to drop a droplet on a desired place. The distance is preferably set to be approximately 0.1 mm to 3 mm (more preferably 1 mm or less). Either the nozzle or the object to be treated moves while keeping the relative distance between the nozzle and the object to be treated, whereby a desired pattern can be drawn.

A step of discharging the conductive material may be performed under a reduced pressure. A step of discharging the conductive material is performed under a reduced pressure because the solvent contained in the conductive material is volatilized while the conductive material is discharged and reaches the object to be treated, and thus, subsequent steps of drying and baking can be omitted or shortened. In addition, by actively using a gas in which 10% to 30% of oxygen in a partial pressure ratio is mixed in a baking step of a composition containing a conductive material, resistivity of a conductive layer forming the second electrodes $E_0$ to $E_m$ can be reduced, and the conductive layer can be thinned and smoothed.

After the composition which forms the second electrodes $E_0$ to $E_m$ is discharged, either one of or both a drying step and a baking step is/are performed under a normal pressure or a reduced pressure by laser beam irradiation, rapid thermal annealing (RTA), heating using a heating furnace, or the like. Both of the drying and baking steps are heat treatment, but for example, drying is performed at 100° C. for three minutes and baking is performed at a temperature of 200° C. to 350° C. for 15 minutes to 120 minutes. Through this step, fusion and welding are accelerated by hardening and shrinking a peripheral resin, after the solvent in the composition is volatilized or the dispersant in the composition is chemically removed. The drying and baking are performed under an oxygen atmosphere, a nitrogen atmosphere, or an atmospheric atmosphere. However, it is preferable that the drying and baking be performed under an oxygen atmosphere in which a solvent in which conductive particles are dissolved or dispersed is easily removed.

Nanopaste has conductive particles, typically nanoparticles each having a grain diameter of 5 nm to 10 nm which are dispersed or dissolved in an organic solvent, and dispersant and a thermosetting resin which is referred to as a binder are also included. A binder has a function of preventing crack or uneven baking during baking. By a drying step or a baking step, evaporation of the organic solvent, decomposition removal of dispersant, and hardening shrinking by the binder proceed concurrently; accordingly, nanoparticles are fused and/or welded to each other to be cured. By a drying step or a baking step, nanoparticles are grown to several tens of nanometers to hundred and several tens of nanometers. Adjacent growing nanoparticles are fused and/or welded to each other to be linked, so that a metal hormogone is formed. On the other hand, most of remaining organic constituents (about 80% to 90%) are pushed out of the metal hormogone; consequently, a conductive layer containing the metal hormogone and a film including an organic constituent that covers an outer side thereof are formed. The film including an organic constituent can be removed in baking nanopaste under an atmosphere containing nitrogen and oxygen by reaction of oxygen contained in the atmospheric air and carbon, hydrogen, or the like which is contained in a film formed of the organic constituent. In addition, in the case where oxygen is not contained in a baking atmosphere, the film including an organic constituent can be removed by separately performing oxygen plasma treatment or the like. A film containing an organic constituent is removed by baking or drying the nanopaste under an atmosphere containing nitrogen and oxygen, then performing oxygen plasma treatment; therefore, smoothing, thinning, and low resistance of a conductive layer containing the remaining metal hormogone can be attempted. Note that, since a solvent in a composition is volatilized by discharging the composition containing a conductive material under a reduced pressure, time of subsequent heat treatment (drying or baking) can be shortened.

The second electrodes $E_0$ to $E_m$ come in contact with the third semiconductor layer 103c forming the photoelectric conversion layer 103. The contact between the second electrodes $E_0$ to $E_m$ and the third semiconductor layer 103c is ohmic contact, whereby low contact resistance can be obtained. Further, the third semiconductor layer 103c is formed using a microcrystalline semiconductor and the third semiconductor layer 103c is formed to a thickness of 30 nm to 80 nm, whereby lower contact resistance can be obtained.

The second electrodes $E_0$ to $E_m$ are formed to be connected to the first electrodes $T_1$ to $T_m$, respectively, in the openings $C_1, C_3, C_5, \ldots, C_{n-1}$. That is, the openings $C_1, C_3, C_5, \ldots, C_{n-1}$ are filled with the same material as the second electrodes $E_0$ to $E_m$. In such a manner, the second electrode $E_1$ can be electrically connected to the first electrode $T_2$, for example, and the second electrode $E_{m-1}$ can be electrically connected to the first electrode $T_m$. In other words, the second electrodes can be electrically connected to the first electrodes adjacent thereto, and each of the photoelectric conversion layers $K_1$ to $K_m$ can obtain electrical connection in series.

A sealing resin layer 105 is formed using an epoxy resin, an acrylic resin, or a silicone resin, Openings 106 and 107 are formed in the sealing resin layer 105 over the second electrode $E_0$ and the second electrode $E_m$ so that connection with an external wiring can be obtained in the openings 106 and 107.

Through the above steps, a unit cell $U_1$ including the first electrode $T_1$, the photoelectric conversion layer $K_1$, and the second electrode $E_1, \ldots$ and a unit cell $U_m$ including the first electrode $T_m$, the photoelectric conversion layer $K_m$, and the second electrode $E_m$ are formed over the substrate 101. The first electrode $T_m$ is connected to the second electrode $E_{m-1}$ adjacent thereto in the opening $C_{n-1}$, and thus, a photoelectric conversion device in which m unit cells are electrically connected in series can be manufactured. Note that the second electrode $E_0$ becomes an extraction electrode of the first electrode $T_1$ in the unit cell $U_1$.

FIGS. 7A to 7C and FIG. 8 show another mode of a photoelectric conversion device according to this embodiment. In FIG. 7A, a substrate 101, a first electrode layer 102, and a photoelectric conversion layer 103 are formed in a manner similar to that described above. Then, second electrodes $E_1$ to $E_q$ are formed by a printing method over the photoelectric conversion layer 103.

As shown in FIG. 7B, openings $C_0$ to $C_n$ which penetrate the photoelectric conversion layer 103 and the first electrode layer 102 are formed by a laser processing method. The openings $C_0, C_2, C_4, \ldots C_{n-2}$, and $C_n$ are openings for insulating and separating unit cells, and the openings $C_1, C_3, C_5, \ldots C_{n-1}$ are openings for forming connections between first electrodes and the second electrodes $E_1$ to $E_q$. The photoelectric conversion layer 103 is sandwiched between the first electrodes and the second electrodes $E_1$ to $E_q$. By formation of the openings $C_0$, to $C_n$, the first electrode layer 102 is divided into first electrodes $T_1$ to $T_m$, and the photoelectric conversion layer 103 is divided into photoelectric conversion layers $K_1$ to $K_m$. In laser processing, residue may be left in the periphery of the openings. This residue is a spray of a processed material and undesirable because the spray heated up to a high temperature by a laser beam is attached to a surface of the photoelectric conversion layer 103 and damages the film. In order to prevent the attachment of the spray or the like, the second electrodes are formed in accordance with patterns of the openings, and laser processing is performed after that; accordingly, at least damage to the photoelectric conversion layer 103 can be prevented.

As shown in FIG. 7C, insulating resin layers $Z_0$ to $Z_m$ with which the openings $C_0, C_2, C_4, \ldots C_{n-2}$, and $C_n$ are filled and which cover upper end portions of the openings $C_0, C_2, C_4, \ldots C_{n-2}$, and $C_n$ are formed by a printing method, for example, a screen printing method.

Figure 8:
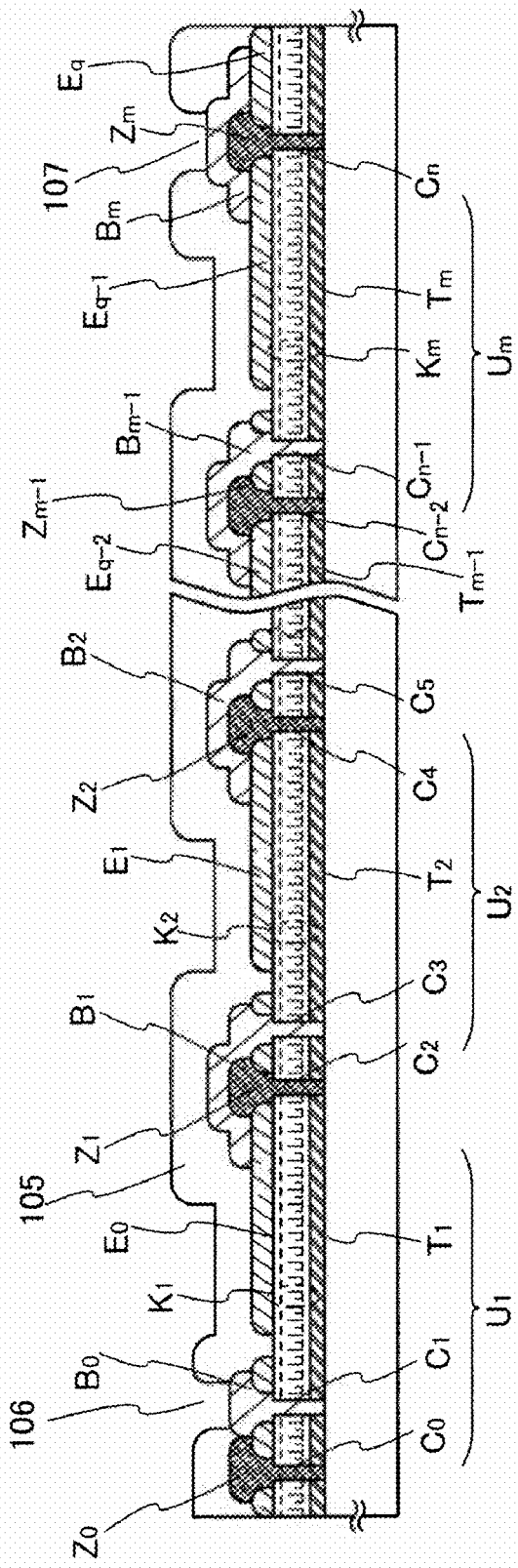
FIG. 8 is a cross-sectional view showing a manufacturing process of an integrated photoelectric conversion device.

Next, as shown in FIG. 8, the openings $C_1, C_3, C_5, \ldots C_{n-1}$ are filled and wirings $B_0$ to $B_m$ which are connected to the first electrodes $T_1$ to $T_m$ are formed by a screen printing method. The wirings $B_0$ to $B_m$ are formed using the same material as the second electrodes, and a thermosetting carbon paste is used here. Note that the wiring $B_m$ is formed over the insulating resin layer $Z_m$, and is made to serve as an extraction wiring. In such a manner, for example, the second electrode $E_1$ can be electrically connected to the first electrode $T_2$, and the second electrode $E_{q-1}$ can be electrically connected to the first electrode $T_m$. In other words, the second electrodes can be electrically connected to the first electrodes adjacent thereto, and each of the photoelectric conversion layers $K_1$ to $K_m$ can obtain electrical connection in series.

Lastly, a sealing resin layer 105 is formed by a printing method. In the sealing resin layer 105, openings 106 and 107 are formed over the wirings $B_0$ and $B_m$, respectively, and the wirings are connected to an external circuit in these openings. Through the above steps, a unit cell $U_1$ including the first electrode $T_1$, the photoelectric conversion layer $K_1$, and the second electrode $E_0, \ldots$ and a unit cell $U_m$ including the first electrode $T_m$, the photoelectric conversion layer $K_m$, and the second electrode $E_{q-1}$ are formed over the substrate 101. The first electrode $T_m$ is connected to the second electrode $E_{q-2}$ adjacent thereto in the opening $C_{n-1}$, and thus, a photoelectric conversion device in which m unit cells are electrically connected in series can be manufactured. Note that the wiring $B_0$ is to be an extraction electrode of the first electrode $T_1$ in the unit cell $U_1$.

In the photoelectric conversion device according to this embodiment, a needle-like crystal is present in the second semiconductor layer forming a photoelectric conversion layer; therefore, a photoelectric conversion device with improved photoelectric conversion characteristics can be obtained. Further, a photoelectric conversion device in which characteristics are hardly degraded by photodegradation can be obtained.

Embodiment 3

In this embodiment, an example of a photo-sensor device is described as another mode of a photoelectric conversion device.

Figure 9:
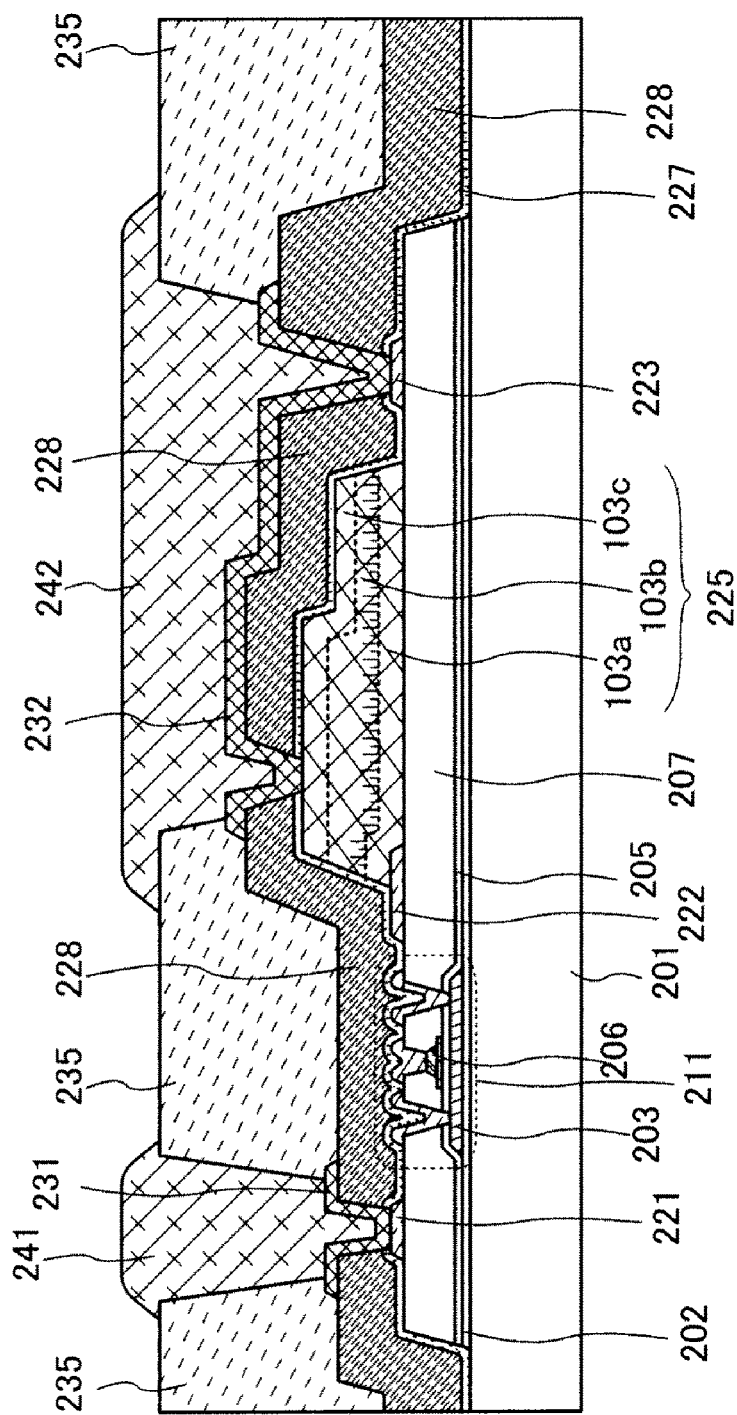
FIG. 9 is a diagram showing a photo-sensor device using a photoelectric conversion layer according to one embodiment of the present invention.

FIG. 9 shows an example of a photo-sensor device according to this embodiment. This photo-sensor device shown in FIG. 9 has a photoelectric conversion layer 225 in a light receiving portion and a function of amplifying an output from the photoelectric conversion layer 225 and outputting the output by an amplifier circuit including a thin film transistor 211. The photoelectric conversion layer 225 and the thin film transistor 211 are provided over a substrate 201. As the substrate 201, a substrate having a light-transmitting property, such as a glass substrate, a quartz substrate, or a ceramic substrate can be used.

An insulating layer 202 including one or more of silicon oxide, silicon nitride oxide, silicon nitride, and silicon oxynitride is provided over the substrate 201 by a sputtering method or a plasma CVD method. The insulating layer 202 is provided for stress relaxation and preventing impurity contaminant. A crystalline semiconductor layer 203 which forms the thin film transistor 211 is provided over the insulating layer 202. A gate insulating layer 205 and a gate electrode 206 are provided over the crystalline semiconductor layer 203. The crystalline semiconductor layer 203, the gate insulating layer 205, and the gate electrode 206 form the thin film transistor 211.

An interlayer insulating layer 207 is provided over the thin film transistor 211. The interlayer insulating layer 207 may be formed of a single insulating layer or a stacked film of insulating layers of different materials. A wiring electrically connected to a source region and a drain region of the thin film transistor 211 is formed over the interlayer insulating layer 207. In addition, over the interlayer insulating layer 207, an electrode 221, an electrode 222, and an electrode 223 which are formed using the same material and the same steps as those of the wiring are formed. The electrodes 221 to 223 are formed using a metal film, for example, a low resistance metal film. Such a low-resistant metal film can be an aluminum alloy, pure aluminum, or the like. Further, as a stacked structure of such a low-resistant metal film and a high-melting-point metal film, a three-layer structure in which a titanium film, an aluminum film, and a titanium film are sequentially stacked may be employed. Instead of the stacked structure of the high-melting-point metal film and the low-resistant metal film, each of the electrodes 221 to 223 can also be formed of a single-layer conductive layer. Such a single-layer conductive layer may be formed of a single-layer film of an element selected from titanium, tungsten, tantalum, molybdenum, neodymium, cobalt, zirconium, zinc, ruthenium, rhodium, palladium, osmium, iridium, or platinum; a single-layer film using an alloy material or a compound material containing the above-mentioned element as its main component; or a single-layer film of nitride of the above-mentioned element, such as titanium nitride, tungsten nitride, tantalum nitride, or molybdenum nitride.

The interlayer insulating layer 207, the gate electrode layer 205, and the insulating layer 202 are subjected to etching processing so as to have end portions in a tapered shape. By processing the end portions of the interlayer insulating layer 207, the gate insulating layer 205, and the insulating layer 202 into a tapered shape, coverage of a protective layer 227 which is formed over these films are improved; therefore, moisture, impurities, and the like hardly enter the insulating layers.

A first semiconductor layer 103a, a second semiconductor layer 103b, and a third semiconductor layer 103c are formed over the interlayer insulating layer 207. Note that the first semiconductor layer 103a is at least partly contacted with the electrode 222. The first semiconductor layer 103a is formed using a microcrystalline semiconductor layer. The second semiconductor layer 103b in which a needle-like crystal is made to grow is formed over the first semiconductor layer 103a by setting the flow rate of a dilution gas (typically hydrogen) to 1 time to 6 times that of a semiconductor source gas (typically silane) at the initial stage of deposition. The needle-like crystal grows toward a surface of the second semiconductor layer 103b from the interface with the first semiconductor layer 103a. Concrete description on the first semiconductor layer 103a, the second semiconductor layer 103b, and the third semiconductor layer 103c is similar to that described with reference to FIGS. 5A to 5C, FIG. 6, FIGS. 7A to 7C, and FIG. 8. The protective layer 227 is formed of, for example, silicon nitride over the photoelectric conversion layer 225. The protective layer 227 can prevent moisture and impurities such as organic matter from being mixed into the thin film transistor 211 and the photoelectric conversion layer 225. Over the protective layer 227, an interlayer insulating layer 228 formed using an organic resin material such as polyimide or acrylic is provided. Over the protective layer 227, an electrode 231 and an electrode 232 are formed. The electrode 231 is electrically connected to the electrode 221, and the electrode 232 is electrically connected to an upper layer of the photoelectric conversion layer 225 (the third semiconductor layer 103c) and the electrode 223 through a contact hole in the interlayer insulating layer 228 and the protective layer 227. As the electrodes 231 and 232, tungsten, titanium, tantalum, silver, or the like can be used.

Further, the following is confirmed: in forming the second semiconductor layer 103b, the flow ratio of a dilution gas to a semiconductor source gas is reduced as compared to a reaction gas used for deposition of the first semiconductor layer 103a to deposit a film; thus, an amorphous semiconductor layer having a needle-like crystal growing in a direction of deposition of the second semiconductor layer 103b from the first semiconductor layer 103a side can be formed. Furthermore, the following is confirmed: a film is deposited by gradually reducing the flow ratio of the dilution gas to the semiconductor source gas as compared to a reaction gas used for deposition of the first semiconductor layer 103a, whereby an amorphous semiconductor layer having a needle-like crystal growing in a direction of deposition of the second semiconductor layer 103b from the first semiconductor layer 103a side can be formed.

An interlayer insulating layer 235 is provided over the interlayer insulating layer 228 by a screen method or an ink-jet method, using an organic resin material such as an epoxy resin, polyimide, acrylic, or a phenol resin. The interlayer insulating layer 235 is provided with openings over the electrode 231 and the electrode 232. Over the interlayer insulating layer 235, an electrode 241 that is electrically connected to the electrode 231 and an electrode 242 that is electrically connected to the electrode 232 are provided by a printing method, for example, using a nickel paste.

In the photoelectric conversion device shown in FIG. 9 which functions as a photo-sensor device, a needle-like crystal is present in the second semiconductor layer 103b forming a main portion of a layer which converts light into electricity; therefore, a photoelectric conversion device with excellent photoelectric conversion characteristics as compared to a conventional photoelectric conversion device using a amorphous silicon thin film can be obtained. Note that although FIG. 9 shows a photo-sensor device which has the photoelectric conversion layer 225 in the light receiving portion and amplifies an output from the photoelectric conversion layer 225 and outputs the output by an amplifier circuit including the thin film transistor 211, the device can be used as a photosensor if a structure relating to an amplifier circuit is omitted.

Embodiment 4

In this embodiment, a photoelectric conversion device having a structure different from that in the above embodiments is described.

Figure 10:
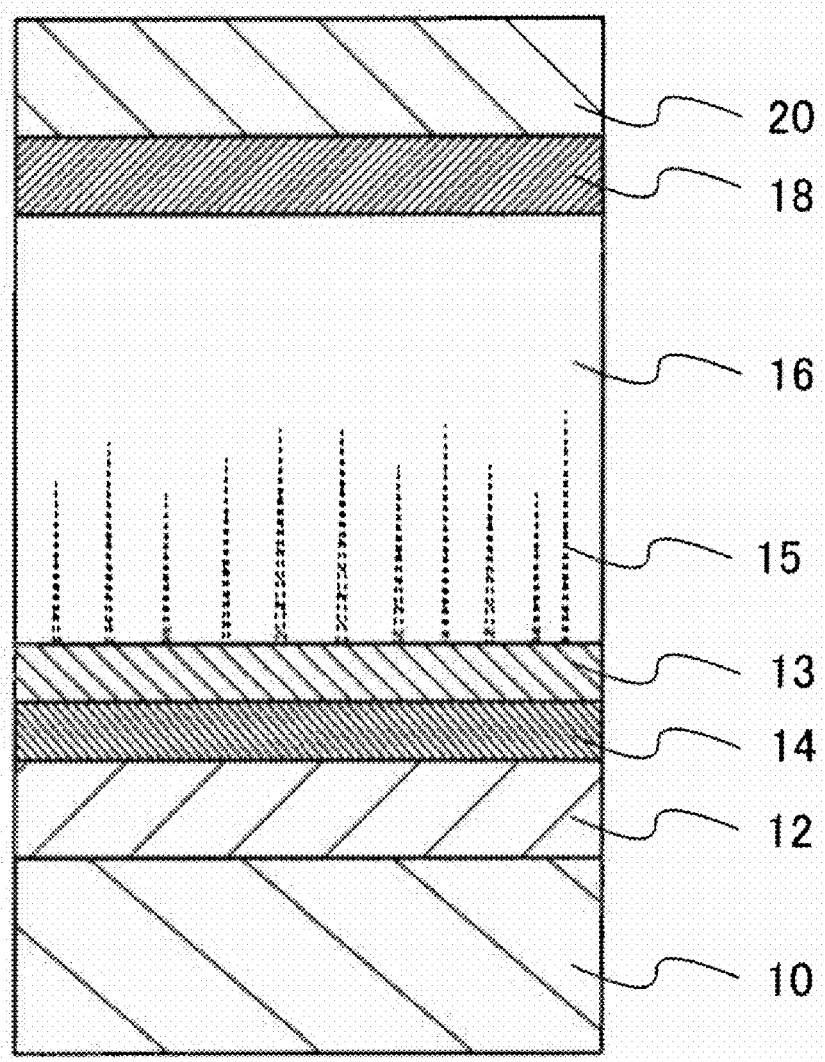
FIG. 10 is a diagram showing a photoelectric conversion device according to one embodiment of the present invention.

FIG. 10 shows a structure of a photoelectric conversion device according to this embodiment. The photoelectric conversion device includes at least one semiconductor junction by providing a second semiconductor layer 16 of an i type semiconductor which is interposed between a first semiconductor layer 14 of a p type semiconductor and a third semiconductor layer 18 of an n type semiconductor. The first semiconductor layer 14 is formed using a microcrystalline semiconductor. The second semiconductor layer 16 is formed over the first semiconductor layer 14 by setting the flow rate of a dilution gas (typically hydrogen) to 1 time to 6 times that of a semiconductor source gas (typically silane) at least at the initial stage of deposition. In the second semiconductor layer 16, a needle-like crystal 15 grows in a direction of deposition of the second semiconductor layer 16 from the first semiconductor layer 14 side. Note that the first semiconductor layer 14 may be formed using an n type semiconductor and the third semiconductor layer 18 may be formed using a p type semiconductor.

Further, in the photoelectric conversion device shown in FIG. 10, a $p^-$ type semiconductor layer 13 is provided between the first semiconductor layer 14 and the second semiconductor layer 16. The $p^-$ type semiconductor layer 13 is a semiconductor layer in which concentration of an impurity imparting p type conductivity is lower than that of the first semiconductor layer 14. The $p^-$ type semiconductor layer 13 is provided between the first semiconductor layer 14 and the second semiconductor layer 16, whereby a carrier-transporting property in an interface of a semiconductor junction is improved. In this case, the p type impurities in the $p^-$ type semiconductor layer 13 are distributed so that concentration thereof is decreased in stepwise or in a continuous manner from the first semiconductor layer 14 to the second semiconductor layer 16, whereby a carrier-transporting property is further improved. Further, an interface level density is reduced and the diffusion potential is improved by this structure, whereby an open circuit voltage of the photoelectric conversion device is increased. The $p^-$ type semiconductor layer 13 having such a junction structure is formed using a microcrystalline semiconductor, typically microcrystalline silicon. By formation of the $p^-$ type semiconductor layer 13 of a microcrystalline semiconductor in contact with the second semiconductor layer 16, a needle-like crystal can be made to grow in the second semiconductor layer 16.

As a substrate 10, various glass substrates described in Embodiment 1 can be used. In the case where light is made to enter from the substrate 10 side, a first electrode 12 is formed using a transparent conductive material such as indium oxide, indium tin oxide, or zinc oxide as described in Embodiment 1. On the other hand, in the case where the first electrode 12 is made to serve as a reflective electrode, the first electrode 12 is formed using a metal material such as aluminum, silver, titanium, or tantalum described in Embodiment 1. In the case where the first electrode 12 is made to serve as a reflective electrode, reflectivity can be improved by providing depressions and projections on a surface of the electrode, which is preferable.

Similarly to Embodiment 1, the first semiconductor layer 14 is formed using a microcrystalline semiconductor (typically, microcrystalline silicon) including boron as an impurity element imparting one conductivity type.

Similarly to Embodiment 1, the second semiconductor layer 16 is a substantially intrinsic semiconductor and is formed using an amorphous semiconductor (typically amorphous silicon), and in the second semiconductor layer 16, the needle-like crystal 15 is present. In the second semiconductor layer 16, the needle-like crystal 15 grows in a direction of deposition of the second semiconductor layer 16 from the first semiconductor layer 14 side.

Similarly to Embodiment 1, a semiconductor source gas typified by silane is diluted with a dilution gas typified by hydrogen to form a reaction gas, and the reaction gas is introduced into a reaction space to produce plasma; thus, a film of a microcrystalline semiconductor or an amorphous semiconductor can be deposited. Further, an amorphous semiconductor forming the second semiconductor layer 16 is formed over the first semiconductor layer 14 of a microcrystalline semiconductor by setting the flow rate of a dilution gas to 1 time to 6 times that of a semiconductor source gas at least at the initial stage of deposition. By controlling the amount of dilution of a reaction gas in depositing the second semiconductor layer 16, specifically, by controlling the amount of dilution with a dilution gas, a needle-like crystal can be made to grow in a direction of deposition of the second semiconductor layer 16 from the first semiconductor layer 14 side.

Similarly to Embodiment 1, the third semiconductor layer 18 is formed using a microcrystalline semiconductor or an amorphous semiconductor which includes phosphorus as an impurity element imparting one conductivity type. The second electrode 20 over the third semiconductor layer 18 is formed using a metal material similar to that in Embodiment 1. In a case where light is made to enter from the second electrode 20 side, the second electrode 20 is formed using a transparent conductive material.

Note that a structure in which the p⁻ type semiconductor layer 13 is provided between the first semiconductor layer 14 and the second semiconductor layer 16, that is, a stack of the first semiconductor layer 14, the p⁻ type semiconductor layer 13, the second semiconductor layer 16, and the third semiconductor layer 18 which is shown in FIG. 10 can be applied to an integrated photoelectric conversion device or a photosensor device which is shown in FIGS. 5A to 5C, FIG. 6, FIGS. 7A to 7C, FIG. 8, or FIG. 9.

Embodiment 5

An integrated photoelectric conversion device having a structure different from the above embodiments is described. Hereinafter, a manufacturing process of an integrated photoelectric conversion device according to this embodiment is briefly described.

FIGS. 11A and 11B and FIGS. 12A and 12B show a manufacturing process of a photoelectric conversion device in which a plurality of unit cells is provided over a substrate with an insulating surface and the unit cells are connected in series over the substrate. In FIG. 11A, a first electrode 12 is formed over a substrate 10. The first electrode 12 is separated into a plurality of isolated regions by openings $M_0$ to $M_n$. In order to form the openings $M_0$ to $M_n$, a conductive layer is formed over an entire surface of the substrate 10, and the conductive layer is selectively removed by etching according to an opening pattern or is directly processed using an energy beam such as a laser beam.

In a case where the conductive layer, a semiconductor layer, and an insulating layer which are formed over the substrate 10 are processed using a laser, the processing is preferably performed by concentrating light by an optical system. This is because minute processing becomes possible. In order to process a large-area substrate efficiently as described above, formation of elongated opening patterns by concentrating a laser beam into a linear shape and performing irradiation with a pulsed laser beam at one time or plural times is efficient.

Figure 13A:
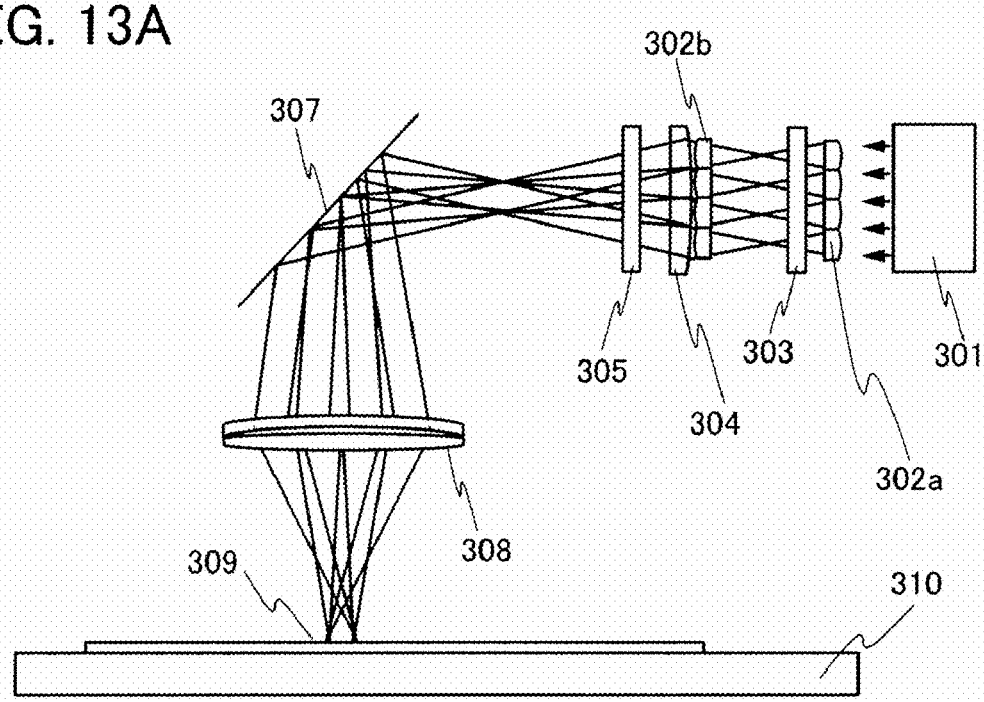
FIGS. 13A and 13B are diagrams showing a structure of a laser irradiation apparatus which processes a thin film.
Figure 13B:
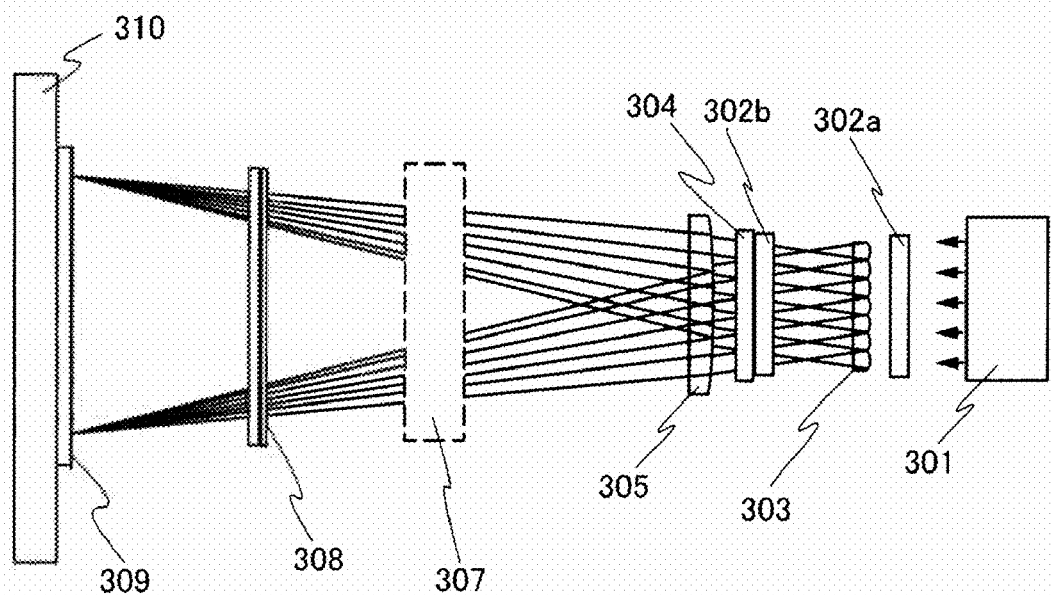

FIGS. 13A and 13B show a structure of a laser irradiation apparatus which processes thin films of a conductive layer, a semiconductor layer, an insulating layer, and the like. As a laser to be a light source, an excimer laser (various excimer lasers such as XeCl, KrF, and ArF) or a solid-state laser (various solid-state lasers such as YAG, YVO₄, and YLF) can be used. In a case where a plurality of layers is stacked as in the photoelectric conversion device, an excimer layer for irradiation with ultra-violet ray is preferably used. In order to control the processing depth, a femtosecond laser may be used. The processing depth can be controlled by setting an irradiation energy and a pulsed interval as appropriate.

The laser irradiation apparatus shown in FIGS. 13A and 13B has an optical system for processing a cross-sectional shape of a laser beam to have a linear shape on an irradiation surface. This optical system is designed so as to homogenize an energy of the laser beam on an irradiation surface as well as converting the cross-sectional shape of the laser beam into a linear shape. FIGS. 13A and 13B are a side view and a top view for illustrating a structure of an optical system, respectively. First, a side view shown in FIG. 13A is described.

A laser beam emitted from a laser 301 is divided in a direction orthogonal to the traveling direction of the laser beam (hereinafter, referred to as a vertical direction) by a cylindrical array lens 302a and a cylindrical array lens 302b. FIG. 13A illustrates a structure in which the laser beam is divided into four beams. The divided laser beams are concentrated by a cylindrical lens 304. The laser beams are unified by a cylindrical lens 305 on an object to be processed 309. Then, the traveling direction of the laser beam is bent by a mirror 307, and the laser beam is concentrated to have a linear shape on the object to be processed 309 on a stage 310 by a doublet cylindrical lens 308. The doublet cylindrical lens means a lens including two cylindrical lenses. Accordingly, energy homogenization in a width direction of the linear laser beam is achieved, and the length in the width direction is determined.

Next, a top view shown in FIG. 13B is illustrated. The laser beam emitted from the laser 301 is divided in a direction orthogonal to the traveling direction of the laser beam and in a direction orthogonal to the vertical direction (hereinafter, referred to as a horizontal direction) by the cylindrical array lens 303. FIG. 13B shows a structure in which the laser beam is divided into seven beams. Then, the laser beams are synthesized by the cylindrical lens 304. Accordingly, energy homogenization in a longitudinal direction of a linear laser beam is achieved, and a length thereof is determined. The linear laser beam processed in the above structure is moved into a width direction of the laser beam, whereby an entire substrate can be processed. In the case of forming an opening, operation of an output pulse of the laser and the stage 310 may be combined. In order to form one opening, a position to be irradiated with a pulsed laser beam may be irradiated with a pulsed laser beam at plural times.

In FIG. 11A, a photoelectric conversion layer is formed after the openings $M_0$ to $M_n$ are formed in the first electrode 12. FIG. 11A illustrates a case where the first semiconductor layer 14 (a p type impurity semiconductor layer), the second semiconductor layer 16 (an i type semiconductor layer), and the third semiconductor layer 18 (an n type impurity semiconductor layer) are formed in this order from the first electrode 12 side (the structure shown in FIG. 1). As a structure of the photoelectric conversion layer, a structure shown in FIG. 4 and FIG. 10 can also be employed instead of this structure.

In FIG. 11B, openings $C_0$ to $C_n$ are formed in the photoelectric conversion layer. The openings $C_0$ to $C_n$ penetrate the first semiconductor layer 14, the second semiconductor layer 16, and the third semiconductor layer 18, and the processing is performed so that a surface or a side face of the first electrode 12 is exposed. The openings $C_0$ to $C_n$ are formed so as to be adjacent to the openings $M_0$ to $M_n$, with a predetermined interval therebetween. This step can also be performed by laser processing.

In FIG. 12A, second electrodes 20 are formed. The second electrodes 20 are separated by openings $S_0$ to $S_n$. The second electrodes 20 are electrically connected to the first electrodes 12 through the openings $C_0$ to $C_n$. The openings $S_0$ to $S_n$ are formed to be adjacent to the openings $C_0$ to $C_n$, respectively, with a predetermined interval therebetween. This step can also be performed by laser processing. In the case of performing laser processing, selective processing becomes easy when chromium, which has a sublimation property, is used for the second electrodes 20.

Accordingly, a plurality of unit cells can be formed, each having the photoelectric conversion layer between the first electrodes 12 and the second electrodes 20. Thus, an integrated structure in which adjacent unit cells are connected in series can be obtained.

FIG. 12B shows a structure in which an extraction electrode 22 is provided over the second electrodes 20 and is covered with a protective film 24, and a protective film 25 is further provided. The protective film 25 has a three-layer structure. A layer 26 of ethylene vinyl acetate (EVA) is an adhesive layer which is melted when being heated. An aluminum foil 27 is a layer for moisture proof which prevents water vapor from entering from outside. An outer surface film 28 is formed using polyethylene terephthalate (PET) or the like. Accordingly, a photoelectric conversion device in which the plurality of unit cells is connected to each other over the substrate 10 can be obtained.

EXAMPLE 1

In this example, a manufacturing process of a sample in which a first semiconductor layer formed using microcrystalline silicon and a second semiconductor layer formed using amorphous silicon are stacked, and the result of observation of the manufactured sample are described.

First, a method for manufacturing the sample is described. A base to be treated was transferred into a reaction chamber of a plasma CVD apparatus, and over the base to be treated, a first semiconductor layer and a second semiconductor layer were formed.

The base to be treated was transferred into the reaction chamber of the plasma CVD apparatus, and over the base to be treated, a microcrystalline silicon layer with a thickness of 30 nm was formed as the first semiconductor layer. Here, the microcrystalline silicon layer was deposited under the following condition: the RF power source frequency was 60 MHz; the power of the RF power source was 15 W; the deposition temperature was 280° C.; the flow ratio of silane to hydrogen was 1:50; and the pressure was 100 Pa.

Then, the base to be treated provided with the first semiconductor layer was transferred from the reaction chamber and was moved to another reaction chamber of the plasma CVD apparatus without exposure to the atmosphere, and, over the first semiconductor layer, an amorphous silicon layer with a thickness of 80 nm was formed as the second semiconductor layer. Here, an amorphous silicon layer was formed under the following condition: the RF power source frequency was 27 MHz, the power of the RF power source was 30 W, the deposition temperature was 280° C., the flow ratio of silane to hydrogen was 1:6, and the pressure was 66.6 Pa.

Figure 14:
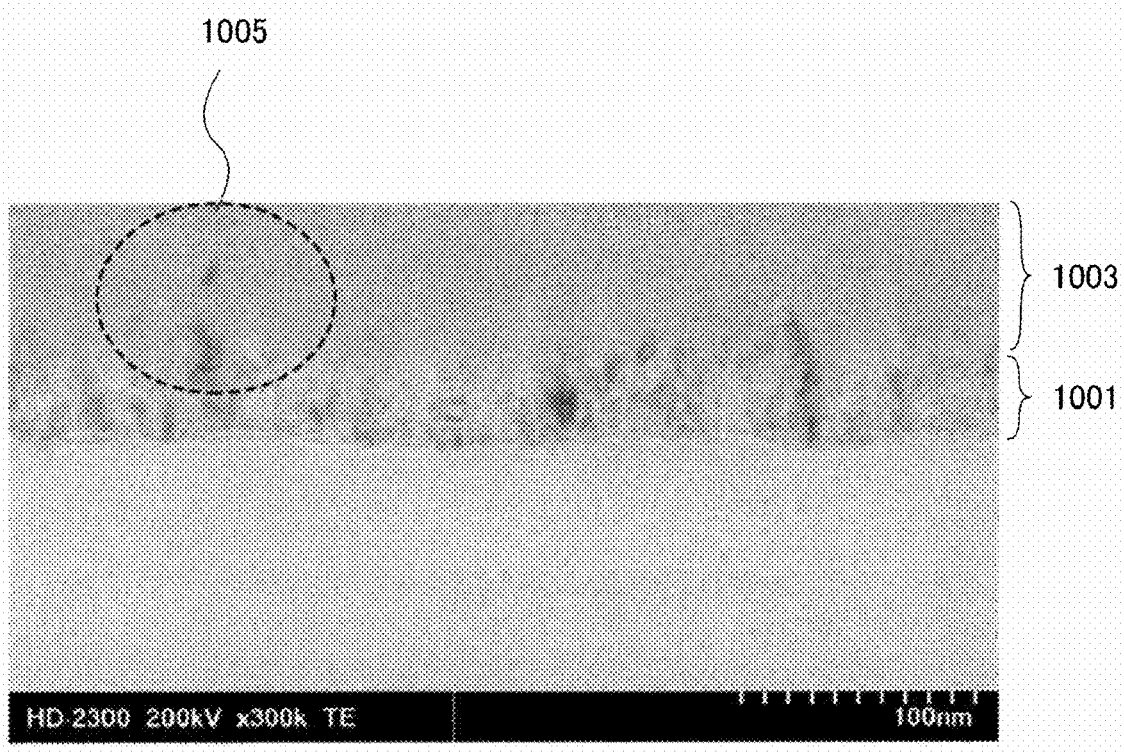
FIG. 14 is a STEM image at a cross section.
Figure 15:
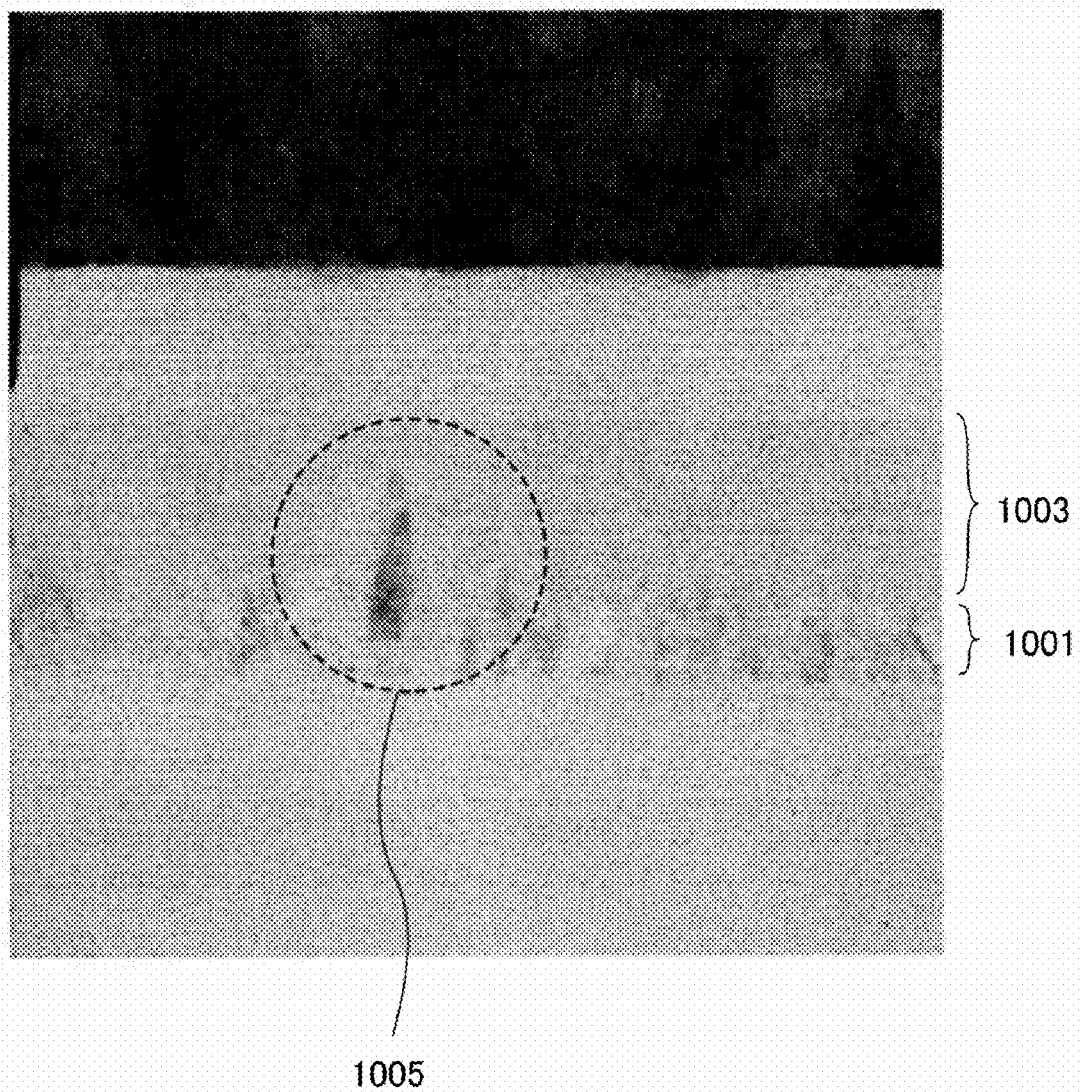
FIG. 15 is a TEM image at a cross section.

The cross section of the thus manufactured sample was observed by a scanning transmission electron microscope (STEM) ("scanning transmission electron microscope HD-2300", which is manufactured by Hitachi High-Technologies Corporation). FIG. 14 is a STEM image of a cross section of the sample. The STEM image was taken by the STEM. Further, FIG. 15 is a TEM image of a cross section of the sample. The TEM image was taken by a transmission electron microscope (TEM).

A second semiconductor layer 1003 was formed over a first semiconductor layer 1001. Further, in the second semiconductor layer 1003, formation of a needle-like crystal 1005 extending toward a surface of the second semiconductor layer 1003 from the interface with the first semiconductor layer 1001 is shown.

EXAMPLE 2

In this example, the result of observation of a sample manufactured by a method different from that in Example 1 is described below.

A method for manufacturing the sample of this example is described. A base to be treated was transferred into a reaction chamber of a plasma CVD apparatus, and a first semiconductor layer and a second semiconductor layer were formed over a substrate.

The base to be treated was transferred into the reaction chamber of the plasma CVD apparatus, and, over the base to be treated, a microcrystalline silicon layer with a thickness of 20 nm was formed as the first semiconductor layer. Here, a microcrystalline silicon layer was deposited under the following condition: the RF power source frequency was 13.56 MHz; the power of the RF power source was 60 W; the deposition temperature was 280° C.; the flow ratio of silane to hydrogen was 1:150; and the pressure was 280 Pa.

Then, the base to be treated provided with the first semiconductor layer was transferred from the reaction chamber and was moved to another reaction chamber of the plasma CVD apparatus without exposure to the atmosphere, and an amorphous silicon layer with a thickness of 40 nm was formed as the second semiconductor layer. Here, an amorphous silicon layer was formed under the following condition: the RF power source frequency was 13.56 MHz; the power of the RF power source was 60 W; the deposition temperature was 280° C.; the flow ratio of silane to hydrogen was 14:15; and the pressure was 170 Pa.

Figure 16:
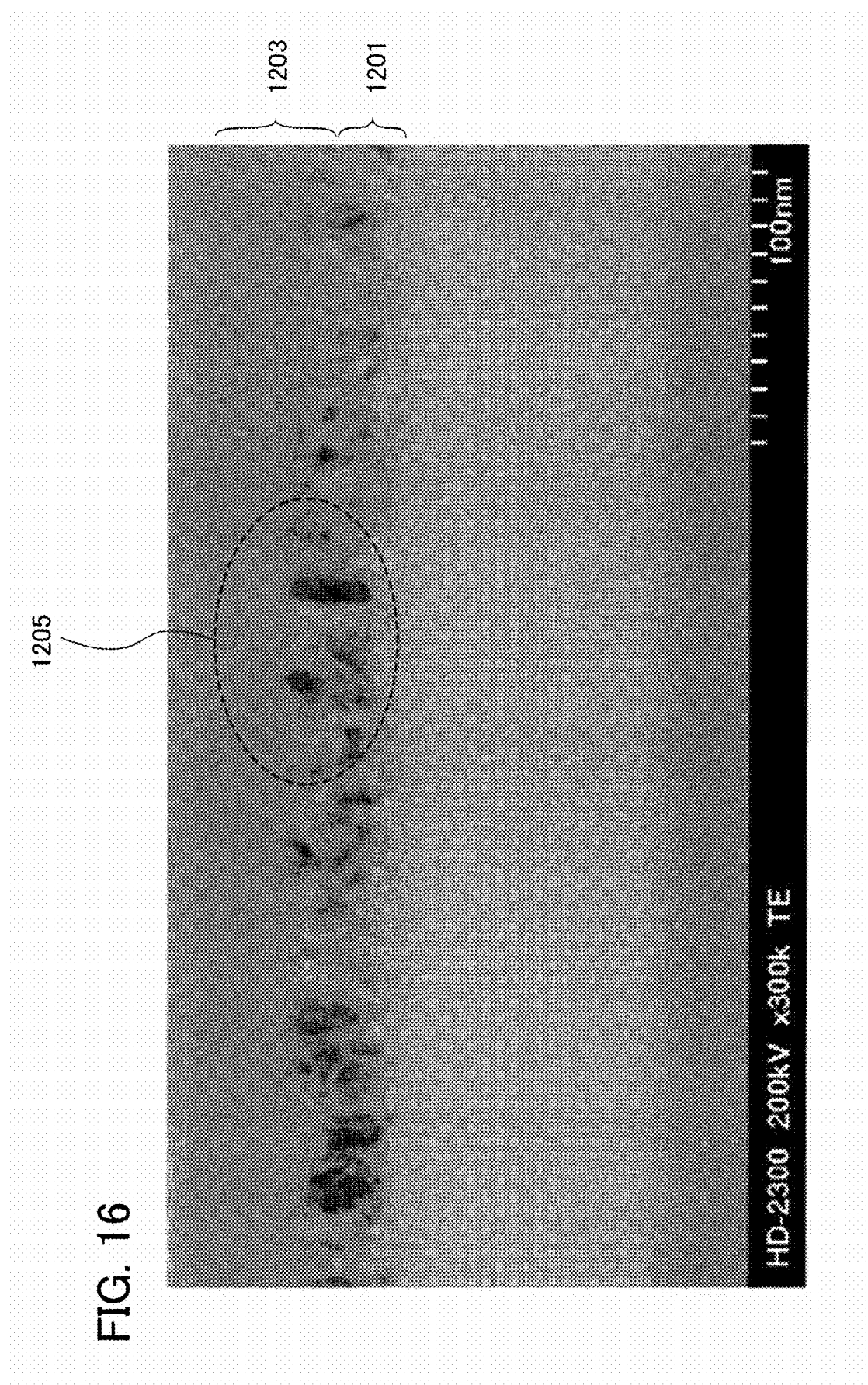
FIG. 16 is a STEM image at a cross section.

The cross section of the thus manufactured sample was observed by a STEM ("scanning transmission electron microscope HD-2300", which is manufactured by Hitachi High-Technologies Corporation). FIG. 16 is a STEM image of a cross section of the sample. The STEM image was taken by the STEM.

A second semiconductor layer 1203 was formed over a first semiconductor layer 1201. Further, in the second semiconductor layer 1203, formation of a needle-like crystal 1205 extending toward a surface of the second semiconductor layer 1203 from the interface with the first semiconductor layer 1201 is shown.

EXAMPLE 3

In this example, the result of observation of a sample manufactured by a method different from that in Examples 1 and 2 is described below.

A method for manufacturing the sample of this example is described. A base to be treated was transferred into a reaction chamber of a plasma CVD apparatus, and a first semiconductor layer and a second semiconductor layer were formed over a substrate.

The base to be treated was transferred into the reaction chamber of the plasma CVD apparatus, and, over the base to be treated, a microcrystalline silicon layer with a thickness of 20 nm was formed as the first semiconductor layer. Here, a microcrystalline silicon layer including phosphorus was deposited under the following condition: the RF power source frequency was 60 MHz; the power of the RF power source was 15 W; the deposition temperature was 320° C.; the ratio of 100-ppm phosphine (diluted with hydrogen):silane:hydrogen was 3:4:400; and the pressure was 100 Pa.

Then, the base to be treated provided with the first semiconductor layer was transferred from the reaction chamber and was moved to another reaction chamber of the plasma CVD apparatus without exposure to the atmosphere, and an amorphous silicon layer with a thickness of 50 nm was formed as the second semiconductor layer. Here, an amorphous silicon layer was formed under the following condition: the RF power source frequency was 27 MHz; the power of the RF power source was 30 W; the deposition temperature was 280° C.; the flow ratio of silane to hydrogen was 1:6; and the pressure was 66.6 Pa. A sample in which a surface of the amorphous silicon layer was coated with platinum (Pt coating) was used, and measurement was performed from the amorphous silicon layer side.

Figure 17:
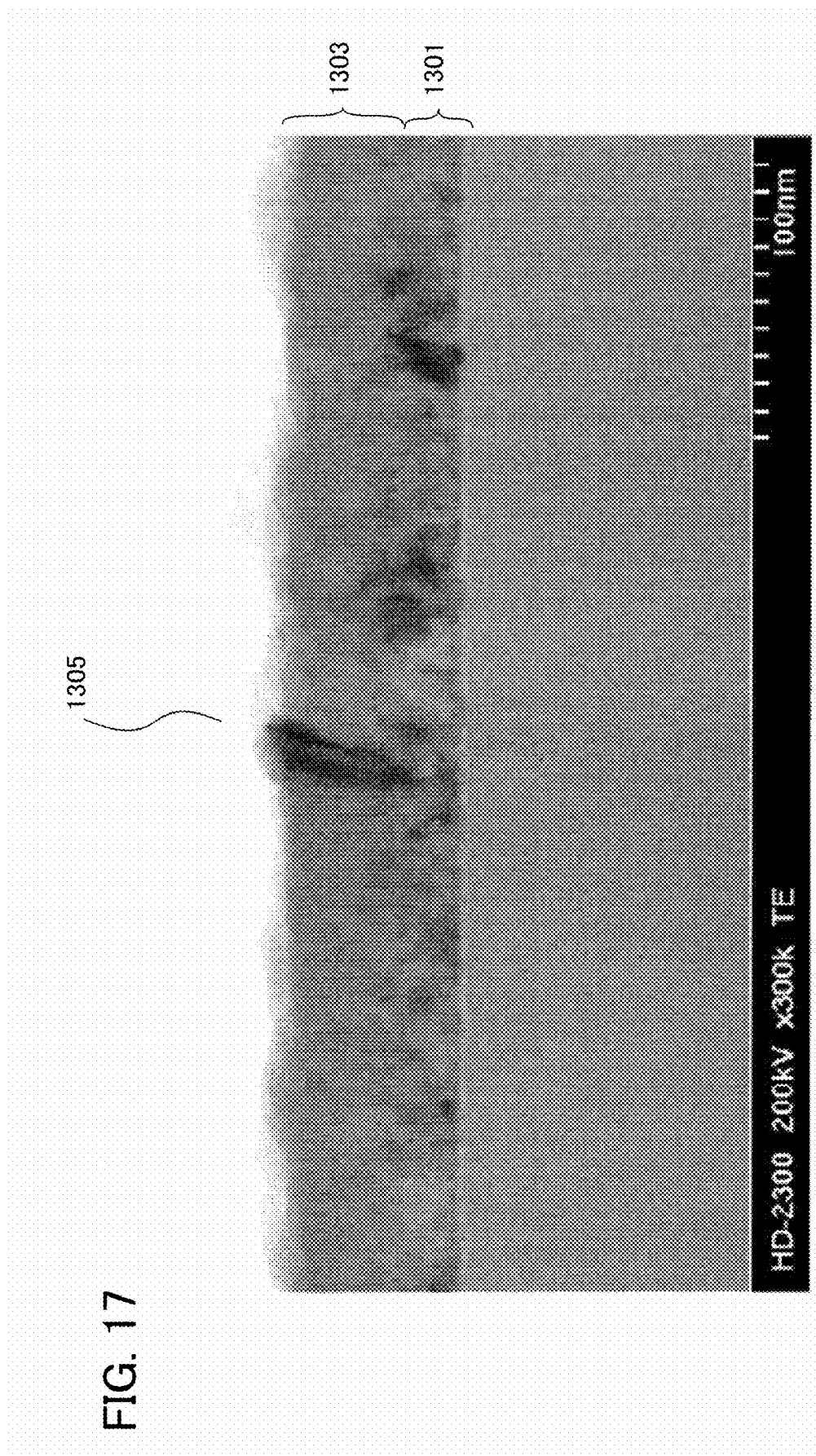
FIG. 17 is a STEM image at a cross section.

The cross section of the thus manufactured sample was observed by a STEM ("scanning transmission electron microscope HD-2300", which is manufactured by Hitachi High-Technologies Corporation). FIG. 17 is a STEM image of a cross section of the sample. The STEM image was taken by the STEM.

A second semiconductor layer 1303 was formed over a first semiconductor layer 1301. Further, in the second semiconductor layer 1303, formation of a needle-like crystal 1305 growing toward a surface of the second semiconductor layer 1303 from the interface with the first semiconductor layer 1301 is shown. In addition, oblique extension of the needle-like crystal 1305 toward the surface of the second semiconductor layer 1303 is shown.

Figure 18:
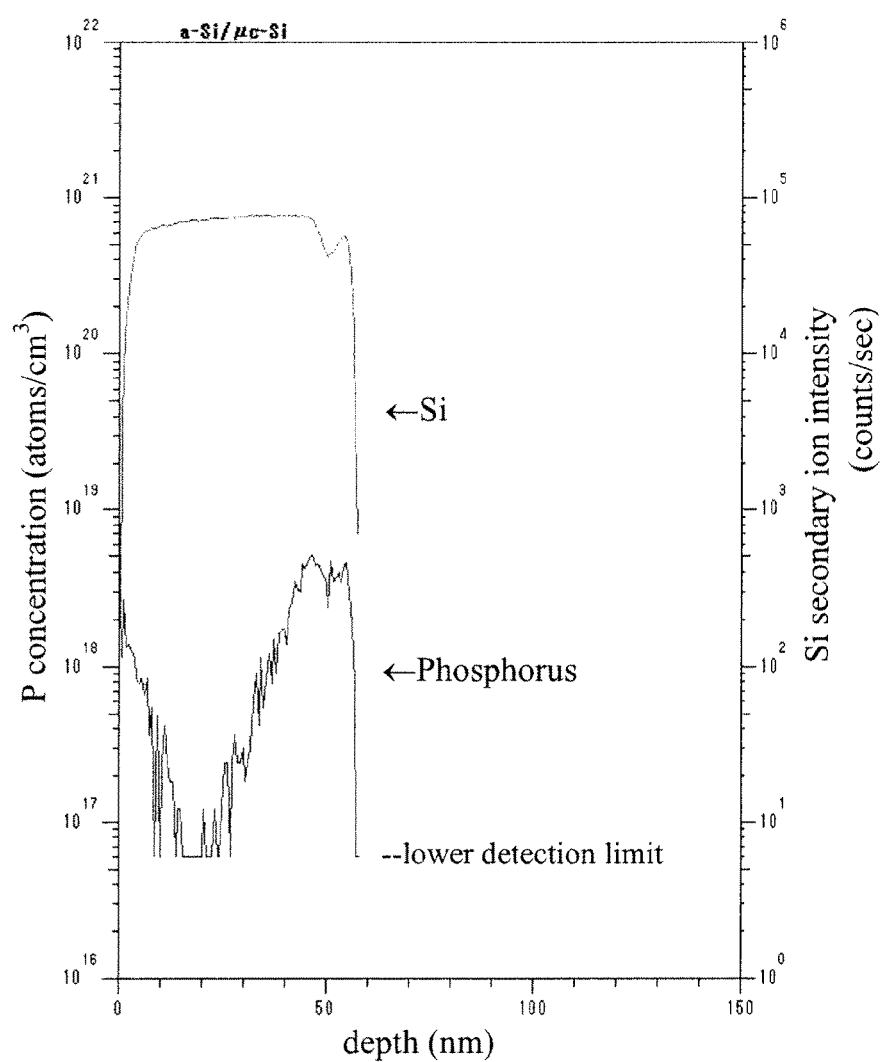
FIG. 18 is a SIMS profile.

The silicon concentration and the phosphorus concentration of the sample were measured using secondary ion mass spectrometry (SIMS). Note that the surface of the amorphous silicon layer (the second semiconductor layer 1303) of the sample was coated with platinum (Pt coating), and the measurement was performed from the amorphous silicon layer (the second semiconductor layer 1303) side. FIG. 18 shows a SIMS profile of the sample. It is apparent from FIG. 18 that the phosphorus concentration is at the lower detection limit of an apparatus used for the SIMS measurement at a depth of approximately 20 nm. In the sample, the amorphous silicon layer (the second semiconductor layer 1303) with a thickness of 50 nm is formed; therefore, the phosphorus concentration in the amorphous silicon layer is at the lower detection limit of the apparatus used for the SIMS measurement. Thus, it is likely that phosphorus does not enter the amorphous silicon layer and phosphorus is not included in a needle-like crystal.

EXAMPLE 4

In this example, the result of observation of a sample manufactured by a method different from that in Examples 1 to 3 is described below. First, a method for manufacturing the sample observed in this example is described.

A glass substrate as a base to be treated was transferred into a reaction chamber of a plasma CVD apparatus, and a semiconductor layer was formed over the glass substrate. Here, the semiconductor layer was formed under the following condition: the RF power source frequency was 60 MHz; the power of the RF power source was 15 W; the deposition temperature was 200° C. or 250° C.; and the pressure was 100 Pa. In addition, silane ($SiH_4$) and hydrogen ($H_2$) were used as a reaction gas. As the reaction gas, at the initial stage of deposition, the flow ratio of silane to hydrogen was 6:400 (sccm). The flow rate of silane was gradually increased in steps, and deposition was performed for 5 minutes in each step. The flow rate of silane was increased by 2 sccm each step. That is, a step in which the flow rate of silane was increased by 2 sccm and deposition was performed for 5 minutes was repeated until the flow rate of silane was increased from 6 sccm to 42 sccm, whereby the semiconductor layer was deposited. In specific, at the start of deposition, deposition was performed for 5 minutes using a reaction gas in which the flow rate of silane is 6 sccm and the flow rate of hydrogen is 400 sccm; then, deposition was performed for another 5 minutes using a reaction gas in which the flow rate of silane is increased by 2 sccm to 8 sccm and the flow rate of hydrogen is 400 sccm; . . . ; deposition was performed for another 5 minutes using a reaction gas in which the flow rate of silane is increased to 40 sccm and the flow rate of hydrogen is 400 sccm; and then, deposition was performed for another 5 minutes using a reaction gas in which the flow rate of silane is increased to 42 sccm and the flow rate of hydrogen is 400 sccm. Thus, the semiconductor layer was deposited.

Figure 19A:
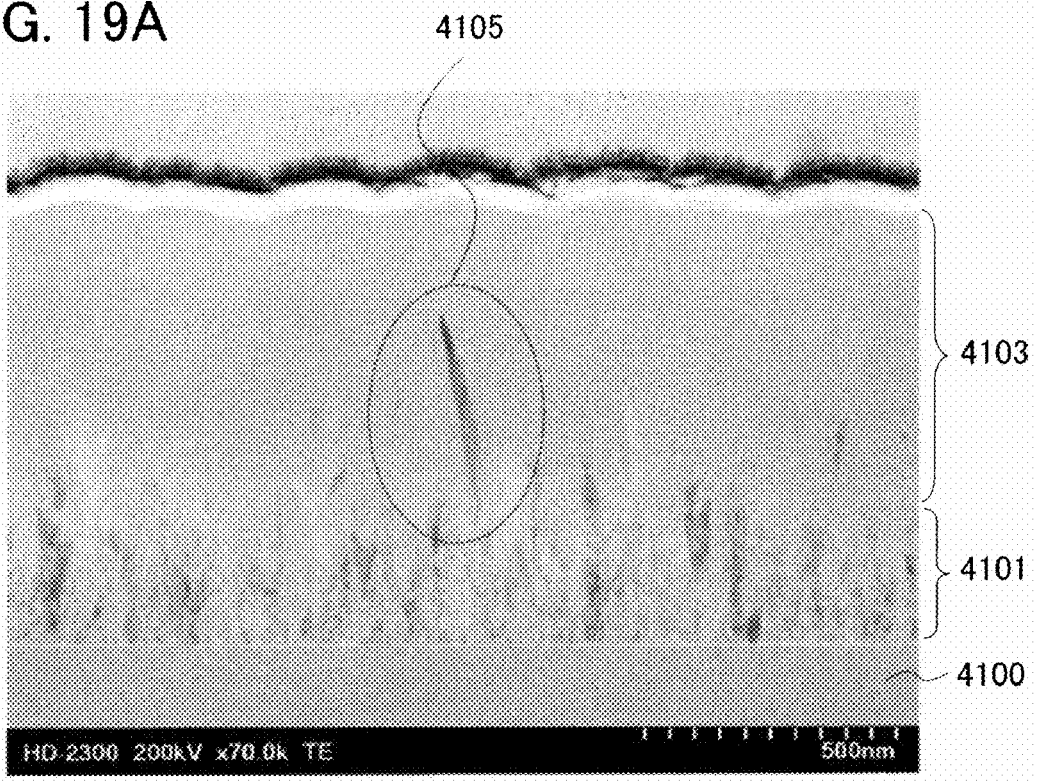
FIGS. 19A and 19B are STEM images at cross sections.
Figure 19B:
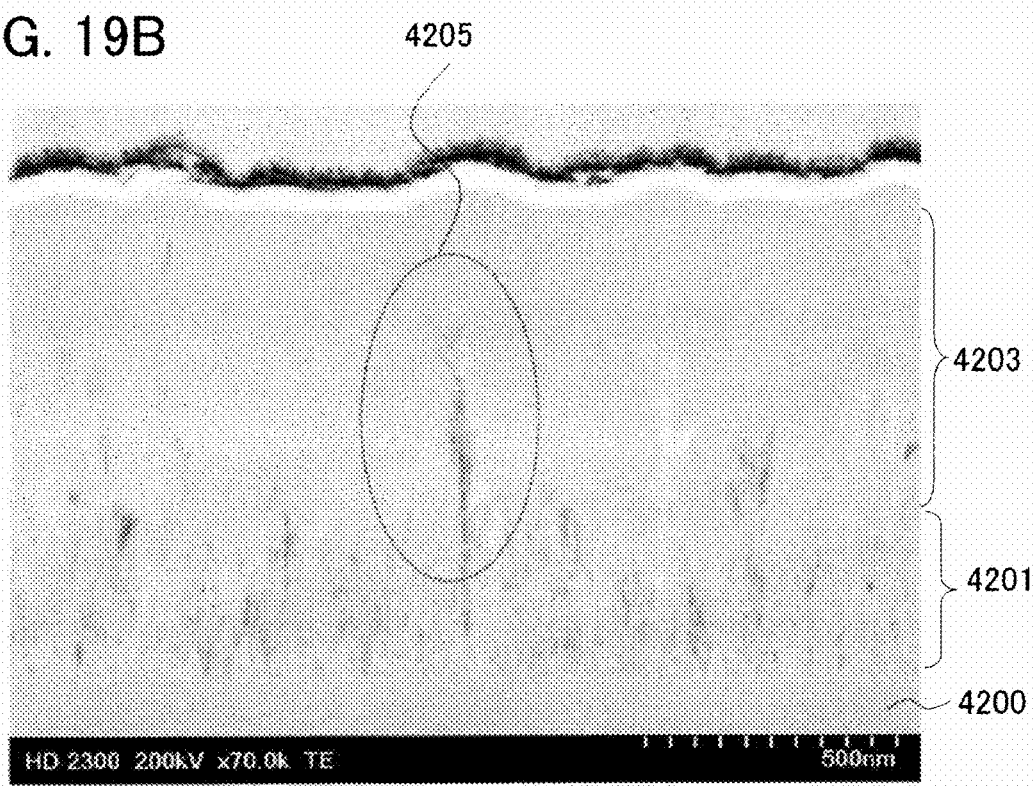

The cross section of the thus manufactured sample was observed by a STEM ("scanning transmission electron microscope HD-2300", which is manufactured by Hitachi High-Technologies Corporation). FIG. 19A is a STEM image of a cross section of the sample manufactured at a deposition temperature of 200° C., and FIG. 19B is a STEM image of a cross section of the sample manufactured at a deposition temperature of 250° C. The STEM images were taken by the STEM.

As shown in FIG. 19A, a region 4101 formed using a microcrystalline semiconductor is formed on the glass substrate 4100 side, and a region 4103 formed using an amorphous semiconductor is formed in a direction of deposition of a film. In addition, as shown in FIG. 19A, a needle-like crystal 4105 is formed which is extended in a direction of deposition of the film and is obliquely extended toward a surface of the film (a surface of the region 4103). As shown in FIG. 19A, the needle-like crystal 4105 is extended to about 420 nm.

As shown in FIG. 19B, a region 4201 formed using a microcrystalline semiconductor is formed on the glass substrate 4200 side is formed, and a region 4203 formed using an amorphous semiconductor is formed in a direction of deposition of a film. In addition, as shown in FIG. 19B, a needle-like crystal 4205 extending in a direction of deposition of the film is formed, and the needle-like crystal 4205 is extended to about 500 nm. In addition, the needle-like crystal 4205 is different from the needle-like crystal 4105 in FIG. 19A in a tapered shape.

From the above description, the following is confirmed: a semiconductor source gas (here, silane) and a dilution gas (here, hydrogen) which are mixed in a mixing ratio at which a microcrystalline semiconductor can be formed are used as a reaction gas, and a film is deposited by gradually reducing the flow ratio of the dilution gas to the semiconductor source gas in the reaction gas, whereby an amorphous semiconductor region including a needle-like crystal extending in a direction of deposition of a film can be formed. In addition, the following is also confirmed: a needle-like crystal can be formed even in the case where the flow rate of a dilution gas is about 10 times or more that of a semiconductor source gas; and an amorphous semiconductor region including a needle-like crystal extending in a direction of deposition of a film can be formed by reducing the flow ratio of a dilution gas to a semiconductor source gas as compared to a reaction gas used for deposition of a microcrystalline semiconductor region to perform deposition.

EXAMPLE 5

In this example, the result of measurement of the hydrogen concentration of a sample manufactured under the same condition as Example 4 by SIMS is described. The flow ratio of silane to hydrogen at the start of deposition was set to 6:400 (sccm) and the flow ratio of silane to hydrogen at the termination of deposition was set to 42:400 (sccm), and, until the flow rate of silane was increased from 6 sccm to 42 sccm while the flow rate of hydrogen was fixed, a step in which the flow rate of silane was increased by 2 sccm and deposition was performed for 5 minutes was repeated. Thus, the semiconductor layer was deposited on a glass substrate. In specific, at the start of deposition, deposition was performed for 5 minutes using a reaction gas in which the flow rate of silane is 6 sccm and the flow rate of hydrogen is 400 sccm; then, deposition was performed for another 5 minutes using a reaction gas in which the flow rate of silane is increased by 2 sccm to 8 sccm and the flow rate of hydrogen is 400 sccm; . . . ; deposition was performed for another 5 minutes using a reaction gas in which the flow rate of silane is increased to 40 sccm and the flow rate of hydrogen is 400 sccm; and then, deposition was performed for another 5 minutes using a reaction gas in which the flow rate of silane is increased to 42 sccm and the flow rate of hydrogen is 400 sccm. Thus, the semiconductor layer was deposited. The semiconductor layer was deposited under the following condition: the RF power source frequency was 60 MHz, the power of the RF power source was 15 W, the deposition temperature was 250° C., and the pressure was 100 Pa.

Figure 20:
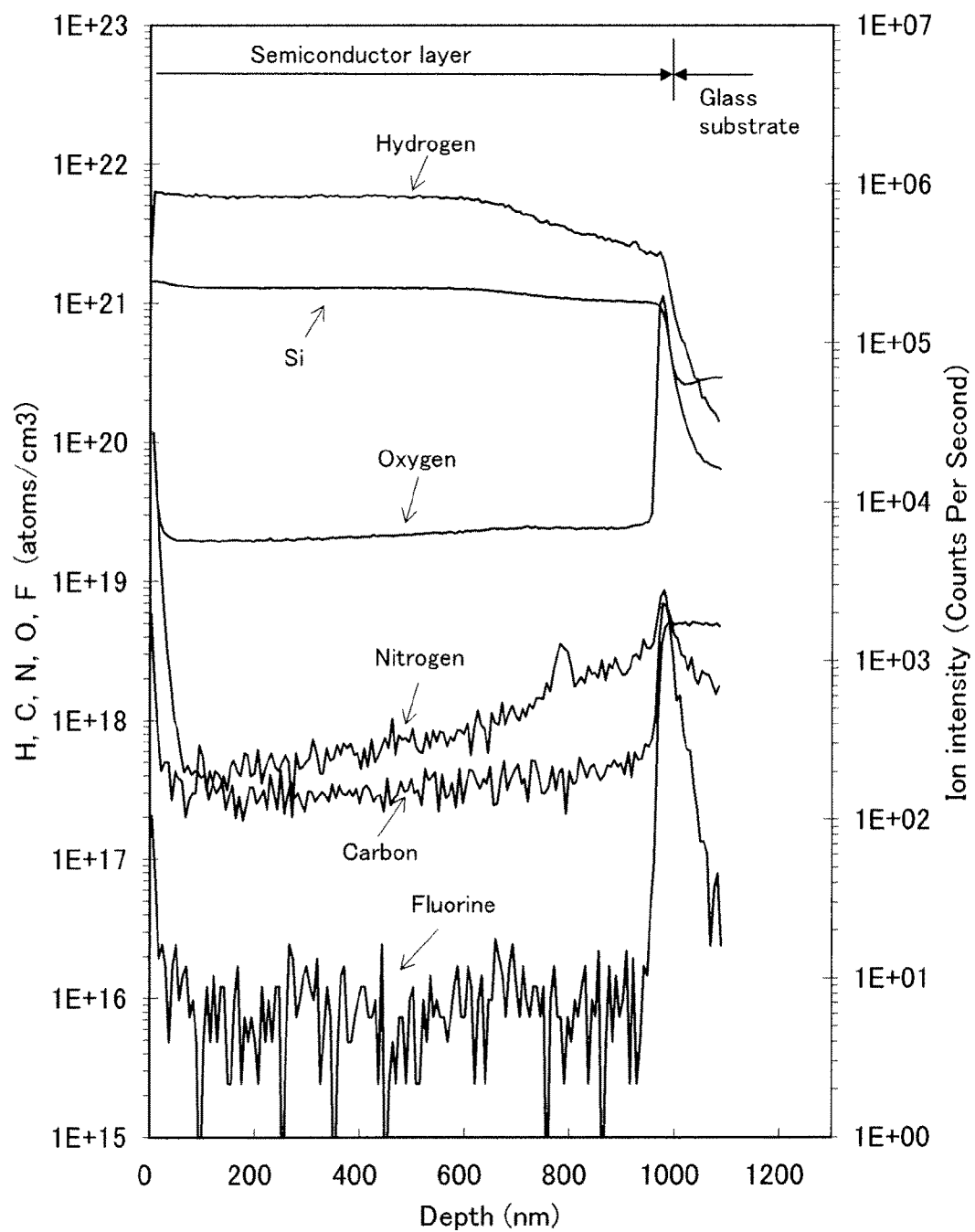
FIG. 20 is a SIMS profile.

FIG. 20 shows a SIMS profile of the sample of this example. In FIG. 20, the hydrogen concentration is increased toward the direction of deposition of the film. Therefore, it is apparent from FIG. 20 that the crystallinity of the semiconductor layer formed in a region from a microcrystalline semiconductor region to an amorphous semiconductor region is varied in accordance with a direction of deposition of a film.

EXAMPLE 6

In this example, the result of observation of a sample with a structure different from that in Examples 1 to 4 is described below. First, a method for manufacturing the sample observed in this example is described.

A layer of an alloy of aluminum and silicon (an Al—Si layer) was formed over a glass substrate by a sputtering method. The glass substrate provided with the Al—Si layer which is a base to be treated was transferred into a reaction chamber of a plasma CVD apparatus, and a semiconductor layer was formed over the glass substrate with the Al—Si layer interposed therebetween. Here, the semiconductor layer was formed under the following condition: the RF power source frequency was 60 MHz; the power of the RF power source was 15 W; the deposition temperature was 200° C.; and the pressure was 100 Pa. In addition, silane ($SiH_4$) and hydrogen ($H_2$) were used for a reaction gas. The semiconductor layer was deposited under the same condition as Example 4 with respect to the flow rate of the reaction gas (the flow ratio of silane to hydrogen at the start of deposition was 6:400 (sccm) and the flow ratio of silane to hydrogen at the termination of deposition was 42:400 (sccm), and a step in which the flow rate of silane was increased by 2 sccm and deposition was performed for 5 minutes was repeated until the flow rate of silane was increased from 6 sccm to 42 seem with the flow rate of hydrogen fixed). In specific, the flow rate of silane was set to 6 sccm and the flow rate of hydrogen was set to 400 sccm at the start of deposition and deposition was performed for 5 minutes; then, the flow rate of silane was increased by 2 sccm to 8 sccm and the flow rate of hydrogen was 400 sccm and deposition was performed form 5 minutes; . . . ; the flow rate of silane was increased to 40 sccm and the flow rate of hydrogen was 400 sccm and deposition was performed for another 5 minutes; and then, the flow rate of silane was increased to 42 sccm and the flow rate of hydrogen was 400 sccm and deposition was performed for another 5 minutes. Thus, the semiconductor layer was deposited.

Figure 21:
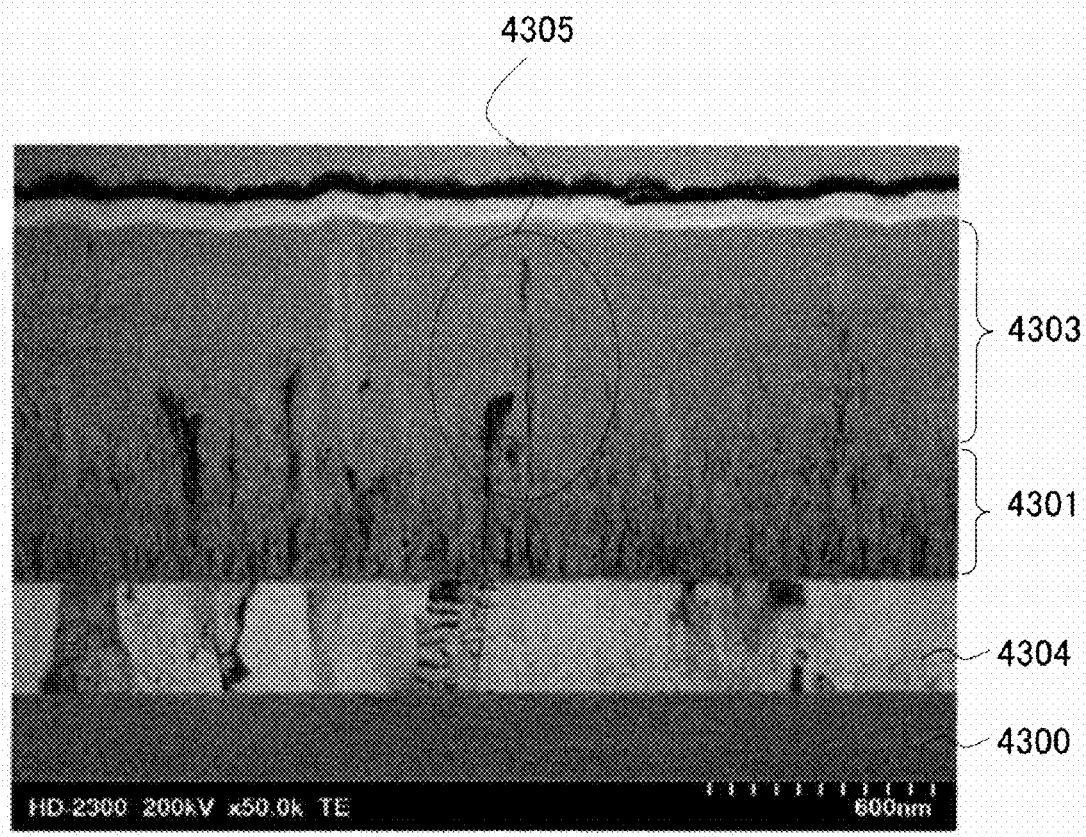
FIG. 21 is a STEM image at a cross section.

The cross section of the thus manufactured sample was observed by a STEM ("scanning transmission electron microscope HD-2300", which is manufactured by Hitachi High-Technologies Corporation). FIG. 21 shows a STEM image at a cross section of the sample.

As shown in FIG. 21, a region 4301 formed using a microcrystalline semiconductor is formed on the glass substrate 4300 side with an Al—Si layer 4304 interposed therebetween, and a region 4303 formed using an amorphous semiconductor is formed in a direction of deposition of a film. In addition, as shown in FIG. 21, a needle-like crystal 4305 is formed which is extended in a direction of deposition of the film.

From the above description, the following is confirmed: a semiconductor source gas (here, silane) and a dilution gas (here, hydrogen) which are mixed in a mixing ratio at which a microcrystalline semiconductor can be formed are used as a reaction gas, and a film is deposited by gradually reducing the flow ratio of the dilution gas to the semiconductor source gas in the reaction gas, whereby an amorphous semiconductor region including a needle-like crystal extending in a direction of deposition of a film can be formed. In addition, the following is also confirmed: a needle-like crystal can be formed even in the case where the flow rate of a dilution gas is about 10 times or more that of a semiconductor source gas; and an amorphous semiconductor region including a needle-like crystal extending in a direction of deposition of a film can be formed by reducing the flow ratio of a dilution gas to a semiconductor source gas as compared to a reaction gas used for deposition of a microcrystalline semiconductor region to perform deposition. Further, the following can also be confirmed: a microcrystalline semiconductor region and an amorphous semiconductor region including a needle-like crystal extending in a direction of deposition of a film can be formed over a conductive layer including aluminum which can serve as an electrode (here, Al—Si layer).

EXAMPLE 7

In this example, the result of measurement of photoconductivity ($\sigma photo$) and dark conductivity ($\sigma dark$) of six kinds of samples (samples A to F) manufactured under different conductions is described. A structure and a manufacturing method of each sample are as follows.

(Sample A)

An amorphous semiconductor layer was formed to a thickness of 100 nm over a glass substrate, and an aluminum layer with a thickness of 100 nm was formed over the amorphous semiconductor layer. The amorphous semiconductor layer was deposited with a plasma CVD apparatus under the following deposition condition: RF power source frequency was 27 MHz; power of the RF power source was 170 W; deposition temperature was 280° C.; pressure was 33.33 Pa. In addition, silane ($SiH_4$) was used for a reaction gas, and the flow rate of the silane was 100 sccm.

(Sample B)

A microcrystalline semiconductor layer was formed to a thickness of 100 nm over a glass substrate, and an aluminum layer with a thickness of 100 nm was formed over the microcrystalline semiconductor layer. The microcrystalline semiconductor layer was deposited with a plasma CVD apparatus under the following condition: RF power source frequency was 60 MHz; power of the RF power source was 30 W; deposition temperature was 280° C.; pressure was 100 Pa. In addition, silane (SiH$_4$) and hydrogen (H$_2$) were used for a reaction gas, and the flow ratio of silane to hydrogen was 4:400 (sccm).

(Sample C)

A semiconductor layer C was formed over a glass substrate to 250 nm as a target thickness, and an aluminum layer was formed to a thickness of 100 nm over the semiconductor layer C. The semiconductor layer C was deposited with a plasma CVD apparatus under the following condition: RF power source frequency was 60 MHz; power of the RF power source was 15 W; deposition temperature was 280° C.; pressure was 100 Pa. In addition, silane (SiH$_4$) and hydrogen (H$_2$) were used for a reaction gas. The semiconductor layer C was formed as follows. The flow ratio of silane to hydrogen in a reaction gas at the start of deposition was set to 6:400 (sccm), and the flow ratio of silane to hydrogen at the termination of the deposition was set to 24:400 (sccm). The flow rate of silane was gradually increased by 2 sccm and the flow rate of hydrogen was fixed, and deposition was performed for 5 minutes in each step.

(Sample D)

A semiconductor layer D was formed over a glass substrate to 500 nm as a target thickness, and an aluminum layer was formed to a thickness of 100 nm over the semiconductor layer D. The semiconductor layer D was formed as follows. The flow ratio of silane to hydrogen in a reaction gas at the start of deposition was set to 6:400 (sccm), and the flow ratio of silane to hydrogen at the termination of the deposition was set to 30:400 (sccm). In addition, the flow rate of silane was gradually increased by 2 sccm and the flow rate of hydrogen was fixed, and deposition was performed for 5 minutes in each step. The deposition condition other than these was the same as that of the sample C.

(Sample E)

A semiconductor layer E was formed over a glass substrate to 750 nm as a target thickness, and an aluminum layer was formed to a thickness of 100 nm over the semiconductor layer E. The semiconductor layer E was formed as follows. The flow ratio of silane to hydrogen in a reaction gas at the start of deposition was set to 6:400 (sccm), and the flow ratio of silane to hydrogen at the termination of the deposition was set to 36:400 (sccm). In addition, the flow rate of silane was gradually increased by 2 sccm and the flow rate of hydrogen was fixed, and deposition was performed for 5 minutes in each step. The deposition condition other than these was the same as that of the sample C.

(Sample F)

A semiconductor layer F was formed over a glass substrate to 1000 nm as a target thickness, and an aluminum layer was formed to a thickness of 100 nm over the semiconductor layer F. The semiconductor layer F was formed as follows. The flow ratio of silane to hydrogen in a reaction gas at the start of deposition was set to 6:400 (sccm), and the flow ratio of silane to hydrogen at the termination of the deposition was set to 42:400 (sccm). In addition, the flow rate of silane was gradually increased by 2 sccm and the flow rate of hydrogen was fixed, and deposition was performed for 5 minutes in each step. The deposition condition other than these was the same as that of the sample C.

Figure 22A:
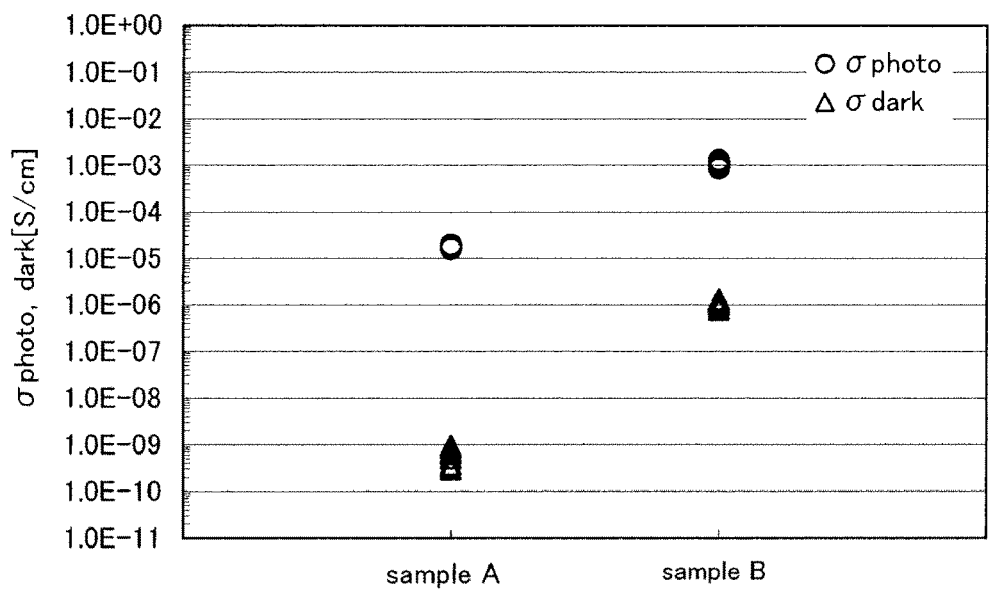
FIGS. 22A and 22B are graphs each showing photoconductivity and dark conductivity.
Figure 22B:
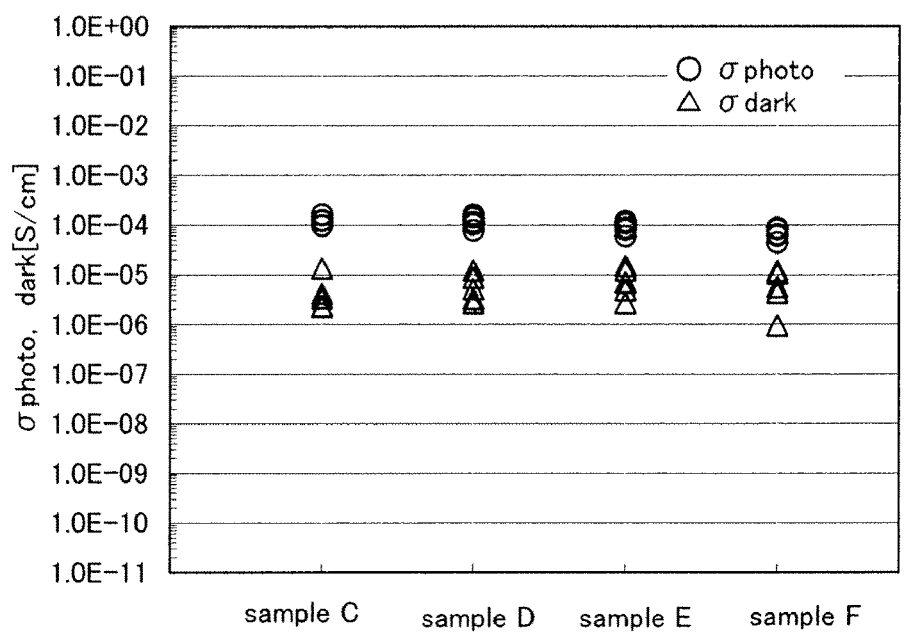

FIG. 22A shows the measurement results of the samples A and B, and FIG. 22B shows the measurement results of the samples C to F.

As shown in FIG. 22A, photoconductivity ($\sigma$photo) of the sample A is approximately 1E-5 (S/cm), and dark conductivity ($\sigma$dark) of the sample A is approximately 1E-10 (S/cm). Further, as shown in FIG. 22A, photoconductivity ($\sigma$photo) of the sample B is approximately 1E-3 (S/cm), and dark conductivity ($\sigma$dark) of the sample B is approximately 1E-6 (S/cm). The semiconductor layer of the sample A is formed using an amorphous semiconductor, and the semiconductor layer of the sample B is formed using a microcrystalline semiconductor. From these results, it is confirmed that high photoconductivity and high dark conductivity are obtained by using a microcrystalline semiconductor layer as a semiconductor layer.

As shown in FIG. 22B, the photoconductivity ($\sigma$photo) of each of the samples C to F is approximately 1E-4 (S/cm) and the dark conductivity ($\sigma$dark) of each of the samples C to F is approximately 1E-5 (S/cm) to 1E-6 (S/cm). Further, as shown in FIG. 22B, the samples C to F have almost the same characteristics as the sample B including a microcrystalline semiconductor layer.

The deposition condition of the semiconductor layers of the samples C to F was similar to that in Example 4. A film is deposited by using silane and hydrogen which are mixed in a mixing ratio at which a microcrystalline semiconductor can be formed, and by gradually reducing the flow ratio of hydrogen to silane in the reaction gas. It is confirmed that, by gradually reducing the flow ratio of hydrogen to silane to perform deposition, a microcrystalline semiconductor region and an amorphous semiconductor region having a needle-like crystal extending in a direction of deposition of a film can be formed over the microcrystalline semiconductor region. From the above description, it can be confirmed that a semiconductor layer including a stacked structure of a microcrystalline semiconductor region and an amorphous semiconductor region having a needle-like crystal extending in a direction of deposition of a film is equal to a microcrystalline semiconductor in characteristics of conductivity.

This application is based on Japanese Patent Application serial no. 2008-116079 filed with Japan Patent Office on Apr. 25, 2008, the entire contents of which are hereby incorporated by reference.

What is claimed is:

1. A method for manufacturing a photoelectric conversion device comprising:
    forming a first electrode over a substrate,
    forming a first semiconductor layer of a microcrystalline semiconductor including an impurity element imparting one conductivity type, over the first electrode, by introducing a reaction gas including a semiconductor source gas and a dilution gas which are mixed in a mixing ratio at which the microcrystalline semiconductor can be formed into a reaction chamber and producing plasma to deposit a film,
    forming a second semiconductor layer including a crystal with a three-dimensional shape tapered in a direction of deposition of a film, over the first semiconductor layer, by reducing a flow ratio of the dilution gas to the semiconductor source gas as compared to the reaction gas used for the first semiconductor layer,
    forming a third semiconductor layer including an impurity element imparting a conductivity type opposite to the first semiconductor layer, over the second semiconductor layer, and
    forming a second electrode over the third semiconductor layer.

2. The method for manufacturing a photoelectric conversion device according to claim 1, wherein the semiconductor source gas is selected from a group consisting of a silicon hydride gas, a silicon fluoride gas, and a silicon chloride gas, and wherein hydrogen is used as the dilution gas.

3. A method for manufacturing a photoelectric conversion device comprising:

forming a first electrode over a substrate, forming a first semiconductor layer of a microcrystalline semiconductor including an impurity element imparting one conductivity type, over the first electrode, forming a second semiconductor layer including a crystal with a three-dimensional shape tapered in a direction of deposition of a film, over the first semiconductor layer, by introducing a semiconductor source gas and a dilution gas which are mixed in a mixing ratio at which an amorphous semiconductor can be formed and producing plasma to deposit the film, wherein a flow rate of the dilution gas is set to 1 time to 6 times a flow rate of the semiconductor source gas at an initial stage of the deposition, forming a third semiconductor layer including an impurity element imparting a conductivity type opposite to the first semiconductor layer, over the second semiconductor layer, and forming a second electrode over the third semiconductor layer.

4. The method for manufacturing a photoelectric conversion device according to claim 3, wherein the semiconductor source gas is selected from a group consisting of a silicon hydride gas, a silicon fluoride gas, and a silicon chloride gas, and wherein hydrogen is used as the dilution gas.

5. The method for manufacturing a photoelectric conversion device according to claim 3, wherein a flow ratio of the dilution gas to the semiconductor source gas is gradually reduced in forming the second semiconductor layer.

6. A method for manufacturing a photoelectric conversion device comprising:

forming a first electrode over a substrate, forming a first semiconductor layer of a microcrystalline semiconductor including an impurity element imparting one conductivity type, over the first electrode, mixing a semiconductor source gas and a dilution gas in a mixing ratio at which an amorphous semiconductor can be formed, producing plasma to deposit a second semiconductor layer including a crystal with a three-dimensional shape tapered in a direction of deposition of a film, over the first semiconductor layer at a flow rate where the dilution gas is set to 1 time to 6 times a flow rate of the semiconductor source gas at an initial stage of the deposition, forming a third semiconductor layer including an impurity element imparting a conductivity type opposite to the first semiconductor layer, over the second semiconductor layer, and forming a second electrode over the third semiconductor layer.

7. The method for manufacturing a photoelectric conversion device according to claim 6, wherein the semiconductor source gas is selected from a group consisting of a silicon hydride gas, a silicon fluoride gas, and a silicon chloride gas, and wherein hydrogen is used as the dilution gas.

8. The method for manufacturing a photoelectric conversion device according to claim 6, wherein a flow ratio of the dilution gas to the semiconductor source gas is gradually reduced in forming the second semiconductor layer.

* * * * *

UNITED STATES PATENT AND TRADEMARK OFFICE
CERTIFICATE OF CORRECTION

PATENT NO. : 7,888,167 B2
APPLICATION NO. : 12/422577
DATED : February 15, 2011
INVENTOR(S) : Shunpei Yamazaki Page 1 of 1

It is certified that error appears in the above-identified patent and that said Letters Patent is hereby corrected as shown below:

In the specification:
Column 1, line 47, change "No," to "No.";
Column 14, line 20, change "(N-diphenylamino)" to "(N,N-diphenylamino)";
Column 20, line 22, after "silicone resin" change "," to "."; and
Column 31, line 59, change "seem" to "sccm".

Signed and Sealed this
Twelfth Day of July, 2011

David J. Kappos
*Director of the United States Patent and Trademark Office*